(12) United States Patent
Tateishi et al.

(10) Patent No.: US 8,552,473 B2
(45) Date of Patent: Oct. 8, 2013

(54) MICRO-ELECTRO-MECHANICAL DEVICE AND MANUFACTURING METHOD FOR THE SAME

(75) Inventors: Fuminori Tateishi, Kanagawa (JP); Konami Izumi, Kanagawa (JP); Mayumi Yamaguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/287,150

(22) Filed: Nov. 2, 2011

(65) Prior Publication Data
US 2012/0043594 A1 Feb. 23, 2012

Related U.S. Application Data

(63) Continuation of application No. 12/842,061, filed on Jul. 23, 2010, now Pat. No. 8,058,145, which is a continuation of application No. 11/469,125, filed on Aug. 31, 2006, now Pat. No. 7,767,543.

(30) Foreign Application Priority Data

Sep. 6, 2005 (JP) .................................. 2005-258072

(51) Int. Cl.
*H01L 29/786* (2006.01)
(52) U.S. Cl.
USPC .......................................... 257/254; 257/415

(58) Field of Classification Search
USPC .......... 257/254, 415, 417, 684, 730, E23.116, 257/E23.18, E23.194, E21.598, E21.002; 438/50–51, 455–457, 149, 197, 106, 125
See application file for complete search history.

(56) References Cited

U.S. PATENT DOCUMENTS

| | | | |
|---|---|---|---|
| 3,723,635 A | | 3/1973 | Smith |
| 4,474,432 A | | 10/1984 | Takamatsu et al. |
| 4,597,635 A | | 7/1986 | Hoshikawa |
| 5,117,282 A | | 5/1992 | Salatino |
| 5,148,266 A | | 9/1992 | Khandros et al. |
| 5,285,107 A | * | 2/1994 | Kazami et al. ................. 257/680 |
| 5,332,921 A | * | 7/1994 | Dousen et al. ................. 257/685 |
| 5,345,205 A | | 9/1994 | Kornrumpf |
| 5,386,341 A | * | 1/1995 | Olson et al. ................... 361/749 |
| 5,397,916 A | | 3/1995 | Normington |
| 5,398,128 A | * | 3/1995 | Tajima et al. ................. 349/150 |
| 5,436,744 A | | 7/1995 | Arledge et al. |

(Continued)

FOREIGN PATENT DOCUMENTS

| | | |
|---|---|---|
| EP | 1 041 406 A1 | 10/2000 |
| JP | 06296380 A | 10/1994 |

(Continued)

*Primary Examiner* — Michele Fan
(74) *Attorney, Agent, or Firm* — Fish & Richardson P.C.

(57) ABSTRACT

It is an object of the present invention to provide a micro-electro-mechanical-device having a microstructure and a semiconductor element over one surface. In particular, it is an object of the present invention to provide a method for simplifying the process of forming the microstructure and the semiconductor element over one surface. A space in which the microstructure is moved, that is, a movable space for the microstructure is formed by processsing an insulating layer which is formed in a process of forming the semiconductor element. The movable space can be formed by forming the insulating layer having a plurality of openings and making the openings face each other to be overlapped each other.

28 Claims, 25 Drawing Sheets

(56) References Cited

U.S. PATENT DOCUMENTS

| | | | |
|---|---|---|---|
| 5,448,511 A | 9/1995 | Paurus et al. | |
| 5,534,727 A * | 7/1996 | Inoue | 257/659 |
| 5,757,456 A | 5/1998 | Yamazaki et al. | |
| 5,776,797 A | 7/1998 | Nicewarner et al. | |
| 5,789,815 A * | 8/1998 | Tessier et al. | 257/723 |
| 5,805,422 A * | 9/1998 | Otake et al. | 361/749 |
| 5,821,138 A | 10/1998 | Yamazaki et al. | |
| 5,834,327 A | 11/1998 | Yamazaki et al. | |
| 6,014,316 A * | 1/2000 | Eide | 361/735 |
| 6,043,669 A | 3/2000 | Carroll | |
| 6,111,761 A * | 8/2000 | Peana et al. | 361/818 |
| 6,121,676 A | 9/2000 | Solberg | |
| 6,208,521 B1 | 3/2001 | Nakatsuka | |
| 6,300,679 B1 | 10/2001 | Mukerji et al. | |
| 6,342,932 B1 | 1/2002 | Terao et al. | |
| 6,444,921 B1 * | 9/2002 | Wang et al. | 174/260 |
| 6,452,238 B1 | 9/2002 | Orcutt et al. | |
| 6,462,412 B2 * | 10/2002 | Kamei et al. | 257/723 |
| 6,486,544 B1 * | 11/2002 | Hashimoto | 257/686 |
| 6,501,528 B1 | 12/2002 | Hamada | |
| 6,501,661 B1 | 12/2002 | Moore et al. | |
| 6,503,384 B1 | 1/2003 | Teshima et al. | |
| 6,548,869 B2 | 4/2003 | Brewer et al. | |
| 6,556,418 B2 | 4/2003 | Aigner et al. | |
| 6,559,522 B1 * | 5/2003 | Kang | 257/668 |
| 6,562,641 B1 * | 5/2003 | Freeman | 438/18 |
| 6,600,222 B1 * | 7/2003 | Levardo | 257/686 |
| 6,670,217 B2 * | 12/2003 | Milla et al. | 438/107 |
| 6,670,700 B1 | 12/2003 | Hashimoto | |
| 6,683,377 B1 * | 1/2004 | Shim et al. | 257/723 |
| 6,699,730 B2 | 3/2004 | Kim et al. | |
| 6,743,656 B2 | 6/2004 | Orcutt et al. | |
| 6,756,663 B2 * | 6/2004 | Shiraishi et al. | 257/686 |
| 6,765,288 B2 | 7/2004 | Damberg | |
| 6,777,258 B1 | 8/2004 | Hunter | |
| 6,841,855 B2 * | 1/2005 | Jaeck et al. | 257/668 |
| 6,860,939 B2 | 3/2005 | Hartzell | |
| 6,867,496 B1 | 3/2005 | Hashimoto | |
| 6,869,825 B2 * | 3/2005 | Chiu | 438/106 |
| 6,879,047 B1 * | 4/2005 | Heo | 257/777 |
| 6,881,611 B1 * | 4/2005 | Fukasawa et al. | 438/114 |
| 6,882,538 B1 * | 4/2005 | Frisch | 361/728 |
| 6,908,792 B2 * | 6/2005 | Bruce et al. | 438/110 |
| 6,956,288 B2 | 10/2005 | Ueno et al. | |
| 6,964,886 B2 | 11/2005 | Kinsman | |
| 6,977,441 B2 | 12/2005 | Hashimoto | |
| 6,991,961 B2 * | 1/2006 | Hubbard et al. | 438/106 |
| 7,045,381 B1 | 5/2006 | Lunceford et al. | |
| 7,045,390 B2 * | 5/2006 | Milla et al. | 438/109 |
| 7,045,438 B2 | 5/2006 | Yamazaki et al. | |
| 7,060,153 B2 | 6/2006 | Yamazaki et al. | |
| 7,067,352 B1 | 6/2006 | Scheid | |
| 7,071,547 B2 * | 7/2006 | Kang et al. | 257/686 |
| 7,081,647 B2 | 7/2006 | Mushika | |
| 7,115,980 B2 * | 10/2006 | Miyagawa et al. | 257/678 |
| 7,122,886 B2 * | 10/2006 | Murayama et al. | 257/686 |
| 7,132,754 B1 * | 11/2006 | Schmidt | 257/778 |
| 7,148,087 B2 * | 12/2006 | Salta, III | 438/126 |
| 7,149,095 B2 * | 12/2006 | Warner et al. | 361/803 |
| 7,154,171 B1 * | 12/2006 | Yoshida | 257/688 |
| 7,176,568 B2 * | 2/2007 | Urushido | 257/735 |
| 7,202,552 B2 | 4/2007 | Zhe et al. | |
| 7,246,431 B2 | 7/2007 | Bang et al. | |
| 7,288,433 B2 * | 10/2007 | Haba et al. | 438/107 |
| 7,291,906 B2 | 11/2007 | Cha et al. | |
| 7,294,928 B2 * | 11/2007 | Bang et al. | 257/737 |
| 7,321,497 B2 * | 1/2008 | Boldt et al. | 361/803 |
| 7,327,028 B2 * | 2/2008 | Chiu | 257/713 |
| 7,368,695 B2 | 5/2008 | Kang et al. | |
| 7,369,415 B2 | 5/2008 | Kojima | |
| 7,397,115 B2 * | 7/2008 | Lee | 257/678 |
| 7,420,267 B2 | 9/2008 | Chao et al. | |
| 7,425,758 B2 * | 9/2008 | Corisis et al. | 257/686 |
| 7,498,201 B2 | 3/2009 | Meyers | |
| 7,514,773 B2 * | 4/2009 | Leddige et al. | 257/686 |
| 7,531,906 B2 * | 5/2009 | Lee | 257/778 |
| 7,563,645 B2 | 7/2009 | Jaeck | |
| 7,692,288 B2 | 4/2010 | Zhe et al. | |
| 7,767,543 B2 | 8/2010 | Tateishi et al. | |
| 7,790,502 B2 | 9/2010 | Scheid | |
| 2001/0006252 A1 | 7/2001 | Kim et al. | |
| 2002/0164838 A1 * | 11/2002 | Moon et al. | 438/107 |
| 2002/0167081 A1 | 11/2002 | Kondo | |
| 2002/0180022 A1 * | 12/2002 | Emoto | 257/686 |
| 2003/0032210 A1 | 2/2003 | Takayama et al. | |
| 2003/0047280 A1 | 3/2003 | Takayama et al. | |
| 2003/0062614 A1 | 4/2003 | Larson | |
| 2003/0196590 A1 | 10/2003 | Hartzell | |
| 2003/0196591 A1 | 10/2003 | Hartzell | |
| 2003/0196592 A1 | 10/2003 | Hartzell | |
| 2003/0196593 A1 | 10/2003 | Hartzell | |
| 2003/0197214 A1 | 10/2003 | Hartzell | |
| 2003/0217805 A1 | 11/2003 | Takayama et al. | |
| 2004/0021211 A1 | 2/2004 | Damberg | |
| 2004/0041247 A1 * | 3/2004 | Kinsman | 257/678 |
| 2004/0104470 A1 | 6/2004 | Bang et al. | |
| 2004/0113275 A1 * | 6/2004 | Karnezos | 257/758 |
| 2004/0232413 A1 | 11/2004 | Yamazaki et al. | |
| 2004/0238936 A1 * | 12/2004 | Rumer et al. | 257/688 |
| 2004/0245217 A1 | 12/2004 | Hunter | |
| 2005/0095745 A1 * | 5/2005 | Sapir | 438/106 |
| 2005/0130360 A1 | 6/2005 | Zhan et al. | |
| 2005/0153475 A1 | 7/2005 | Hartzell | |
| 2005/0158911 A1 | 7/2005 | Uwada et al. | |
| 2005/0180187 A1 | 8/2005 | Koyama | |
| 2005/0227400 A1 | 10/2005 | Chase et al. | |
| 2005/0233497 A1 | 10/2005 | Meyers | |
| 2005/0260782 A1 | 11/2005 | Hunter | |
| 2005/0285231 A1 | 12/2005 | Arao et al. | |
| 2006/0043562 A1 | 3/2006 | Watanabe | |
| 2006/0148137 A1 | 7/2006 | Hartzell et al. | |
| 2006/0223227 A1 | 10/2006 | Kubota et al. | |
| 2006/0261458 A1 | 11/2006 | Paek et al. | |
| 2007/0013036 A1 | 1/2007 | Zhe et al. | |
| 2008/0106874 A1 | 5/2008 | Okuda | |

FOREIGN PATENT DOCUMENTS

| | | |
|---|---|---|
| JP | 2001-144117 A | 5/2001 |
| JP | 2001260092 | 9/2001 |
| JP | 2003-297876 A | 10/2003 |
| JP | 2004-001201 A | 1/2004 |
| JP | 2005-125484 A | 5/2005 |
| JP | 2005161464 A | 6/2005 |
| JP | 2005-531421 A | 10/2005 |
| JP | 2009501442 A | 1/2009 |
| KR | 2000-0071528 A | 11/2000 |
| KR | 2001-0074906 A | 8/2001 |
| WO | 2004/003981 A1 | 1/2004 |
| WO | WO 2005/076358 A1 | 8/2005 |
| WO | 2007010361 A2 | 1/2007 |

* cited by examiner

MICRO-ELECTRO-MECHANICAL DEVICE AND MANUFACTURING METHOD FOR THE SAME

CROSS-REFERENCE TO RELATED APPLICATIONS

This application is a continuation of U.S. application Ser. No. 12/842,061, filed Jul. 23, 2010, now allowed, which is a continuation of U.S. application Ser. No. 11/469,125, filed Aug. 31, 2006, now U.S. Pat. No. 7,767,543, which claims the benefit of a foreign priority application filed in Japan as Serial No. 2005-258072 on Sep. 6, 2005, all of which are incorporated by reference.

BACKGROUND OF THE INVENTION

1. Field of the Invention

The present invention relates to a micro-electro-mechanical device which has a microstructure and a semiconductor element, and a manufacturing method therefor.

2. Description of the Related Art

In recent years, a micro mechanical system called MEMS is actively researched. MEMS is an abbreviated name of a micro-electro-mechanical system, which is sometimes simply called a micromachine. A micromachine in general corresponds to a minute device in which "a movable microstructure having a three-dimensional structure" is integrated using a semiconductor minute processing technique. The microstructure has a three-dimensional structure, a movable portion, and a space for moving.

A micromachine can control its microstructure by using an electronic circuit. Therefore, it is said that an autonomous decentralized type system can be formed which performs a series of operations by processing information obtained by a sensor in an electronic circuit and executing the operation through an actuator or the like, instead of a central processing control type system such as a conventional device using a computer.

Many studies have been made on a micromachine. For example, an advanced MEMS wafer level package is proposed to overcome a problem that a manufacturing process cannot be used with equipment for wafer manufacturing and plastic assembly (Patent Document 1).

In addition, a method of manufacturing a semiconductor package is proposed in which a microstructure and a semiconductor element are separately formed over countering substrates and are electrically connected to each other (Patent Document 2).

In addition, there is a document of a thin-film-shaped and crystallized mechanical device and an electro-mechanical device called MEMS (Patent Document 3). In the Patent Document 3, an amorphous material, a nanocrystalline material, a microcrystalline material, and a polycrystalline material are listed as a starting material of a thin film. As the material thereof, silicon, germanium, silicon germanium, an anisotropic dielectric material, an anisotropic piezoelectric material, copper, aluminum, tantalum, and titanium are listed. In addition, it is described that a thin-film-shaped amorphous silicon layer is formed over a glass substrate, then, crystallized. In the crystallization, laser irradiation is controlled so that in an inner part, a crystalline property which can provide favorable mechanical characteristics is realized.

[Patent Document 1] Japanese Patent Application Laid-Open No. 2001-144117

[Patent Document 2] Japanese Patent Application Laid-Open No. 2003-297876

[Patent Document 3] Japanese Patent Application Laid-Open No. 2004-1201

As described in Patent Document 1, a microstructure in a micromachine is formed by a process using a silicon wafer. In particular, in order to obtain a material with sufficient thickness and strength to manufacture a microstructure, most micromachines in practical use are manufactured using silicon wafers.

In addition, in accordance with a mass productivity of a micromachine having a minunte structure, reduction in manufactureing cost is desired. Therefore, a method in which a microstrucutre and a semiconductor element controlling the microstrucutre are integrated is desired. However, when integrateing a microstrucutre and a semiconductor element, the manufacturing process becomes compelicated since the manuafacturing process of the microstrucutre and that of the semiconductor element are different, e.g., etching of a sacrificial layer. Since the processes are different, when integrating the microstrucutre and the semiconductor element, there is a possibility that the microstrucutre or the semiconductor element is damaged and does not operate. Therefore, most micromachines in practical use have microstrucutres and semiconductor elements manufactured in different processes.

SUMMARY OF THE INVENTION

In view of the foregoing, it is an object of the present invention to provide a micromachine (hereinafter referred to as a micro-electro-mechanical-device) having a microstructure and a semiconductor element over one surface. In particular, it is an object of the present invention to provide a method for simplifying the process of forming a microstructure and a semiconductor element over one surface.

In view of the foregoing problems, in the present invention, a space in which a microstructure is moved, that is, a movable space for the microstructure is formed by procecssing an insulating layer which is formed in a process of forming a semiconductor element. The movable space can be formed by forming an insulating layer having a plurality of openings and making the openings face each other to be overlapped each other.

In particular, in order to solve the foregoing problems, the present invention provides the following methods.

One example of the present invention is a manufacturing method of a micro-electro-mechanical device which includes, forming a peeling layer, forming a first structure layer in a first region over the peeling layer, forming a first insulating layer covering the first structure layer, forming a first opening in the first insulating layer in the first region so that the first structure layer is exposed, forming a second structure layer in a second region, forming a second insulating layer covering the first opening and the second structure layer, forming second openings in the second insulating layer so that the first structure layer and the second structure layer are exposed, removing the peeling layer, and forming a space between the first structure layer and the second structure layer by making the second openings face each other to be overlapped each other. That is, the second openings are formed in the second insulating layer both in the first region and the second region.

One example of the present invention is a manufacturing method of a micro-electro-mechanical device which includes, forming a peeling layer, forming a first structure layer in a first region over the peeling layer, forming a first insulating layer covering the first structure layer, forming a first opening in the first insulating layer in the first region so that the first structure layer is exposed, forming a second structure layer in a second region, forming a second insulating layer which contains an organic material to cover the first opening and the second structure layer, forming second openings in the second insulating layer so that the first structure layer and the second structure layer are exposed, removing the peeling layer, and forming a space between the first structure layer and the second structure layer by making the second openings face each other to be overlapped each other.

One example of the present invention is a manufacturing method of a micro-electro-mechanical device which includes, forming a peeling layer, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer covering the first opening, the conductive layer, and the second structure layer, forming third openings in the second insulating layer in the first region and the second region so that the first structure layer and the second structure layer are exposed, removing the peeling layer, and forming a space between the first structure layer and the second structure layer by making the third openings face each other to be overlapped each other.

One example of the present invention is a manufacturing method of a micro-electro-mechanical device which includes, forming a peeling layer, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer which contains an organic material to cover the first opening, the conductive layer, and the second structure layer, forming third openings in the second insulating layer in the first region and the second region so that the first structure layer and the second structure layer are exposed, removing the peeling layer forming a space between the first structure layer and the second structure layer by making the third openings face each other to be overlapped each other. That is, the third openings are formed in the second insulating layer both in the first region and the second region so as to expose the first structure layer and the second structure layer, respectively.

One example of the present invention is a manufacturing method of a micro-electro-mechanical device which includes, forming a peeling layer over a first substrate, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer covering the first opening, the conductive layer, and the second structure layer, forming third openings in the second insulating layer in the first region and the second region so that the first structure layer and the second structure layer are exposed, removing the peeling layer and separating the first substrate, transferring the micro-electro-mechanical device to a resin substrate (a flexible substrate), and folding the resin substrate so that a space is provided between the first structure layer and the second structure layer.

One example of the present invention is a manufacturing method of a micro-electro-mechanical device which includes, forming a peeling layer over a first substrate, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer which contains an organic material to cover the first opening, the conductive layer, and the second structure layer, forming third openings in the second insulating layer in the first region and the second region so that the first structure layer and the second structure layer are exposed, removing the peeling layer and separating the first substrate, transferring the micro-electro-mechanical device to a resin substrate, and folding the resin substrate so that a space is provided between the first structure layer and the second structure layer.

One example of the present invention is a manufacturing method of a micro-electro-mechanical device which includes, forming a peeling layer over a first substrate, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer so as to cover the first opening, the conductive layer, and the second structure layer, forming third openings in the second insulating layer in the first region and the second region so that the first structure layer and the second structure layer are exposed, removing the peeling layer and separating the first substrate, transferring the micro-electro-mechanical device to a flexible substrate provided with a first opening portion and a second opening portion, and folding the flexible substrate so that the first opening portion and the second opening portion face each other.

One example of the present invention is a manufacturing method of a micro-electro-mechanical device which includes, forming a peeling layer over a first substrate, forming a first structure layer and a semiconductor layer in a first region and a second region over the peeling layer, respectively, forming a first insulating layer covering the first structure layer and the semiconductor layer, forming a first opening in the first insulating layer in the first region so that the first structure in the first region is exposed, and a second opening in the first insulating layer in the second region, forming a conductive layer and a second structure layer so as to fill the second opening, forming a second insulating layer which contains an organic material to cover the first opening, the conductive layer, and the second structure layer, forming third openings in the second insulating layer in the first region and the second region so that the first structure layer and the second structure layer are exposed, removing the peeling layer and separating the first substrate, transferring the micro-electro-mechanical device to a flexible substrate provided with a first opening portion and a second opening portion, and folding the flexible substrate so that the first opening portion and the second opening portion face each other.

In the present invention, the space may be closed by being sealed or may be opened.

In the present invention, the first structure layer, the second structure layer, and the space can form a capacity.

As described above, in the present invention, the microstructure and the semiconductor element are formed over one surface. Conventionally, a space for moving the microstructure is formed by etching a sacrifice layer or deeply etching a silicon wafer. In the present invention however, a space is formed by processing an insulating layer which is formed in a manufacturing process of a semiconductor element. Therefore, a manufacturing process can be simplified, which leads to improvement in production efficiency and reduction in cost, and even reduction in damage of the microstructure being manufactured can be realized.

Thus, by manufacturing the microstructure and the semiconductor element over one surface, a micro-electro-mechanical device with simple assembly and package, and low manufacturing cost can be provided.

In addition, in the present invention, polycrystalline silicon which is crystallized using a metal such as nickel can be used for a structure layer in a microstructure and an active layer of a semiconductor element. Therefore, a micro-electro-mechanical device having a microstructure which can resist external force and stress and a semiconductor element with faborable element characteristics over one surface can be provided.

DETAILED DESCRIPTION OF THE INVENTION

Figure 1A:
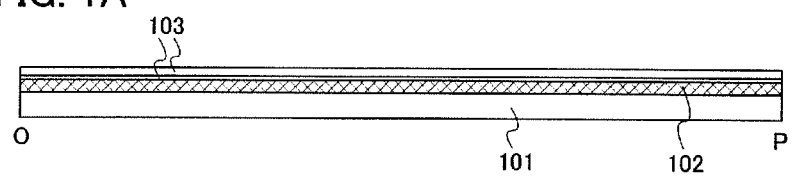
FIGS. 1A to 1E show a manufacturing process for a micro-electro-mechanical device of the present invention.

Hereinafter, embodiment modes of the present invention are explained with reference to the drawings. However, the present invention is not limited to the following description. As is easily understood to a person skilled in the art, the mode and the detail of the present invention can be variously changed without departing from the spirit and the scope of the present invention. Thus, the present invention is not interpreted as being limited to the following description of the embodiment modes. Note that like portions in the different drawings are denoted by the like reference numerals when describing a structure of the invention with reference to the drawings.

Embodiment Mode 1

In this embodiment mode, a method of forming a microstructure and a semiconductor element over one surface is described with reference to the drawings. In the drawings, top views and cross-sectional views taken along a line O-P in the top views are shown.

A microstructure and a semiconductor element of the present invention can be formed over one surface of a substrate having an insulating property (insulating substrate). As an insulating substrate, there are a glass substrate, a quartz substrate, a plastic substrate, and the like. For example, by forming a microstructure and a semiconductor element over a plastic substrate, a light-weight micro-electro-mechanical device having high flexibility can be manufactured. In addition, by thinning a glass substrate by polishing or the like, a thin micro-electro-mechanical device can be manufactured. Further, a substrate obtained by forming a layer having an insulating property (insulating layer) over a conductive substrate such as metal or a semiconductor substrate such as silicon can also be used as an insulating substrate.

First, a peeling layer 102 is formed over an insulating subtrate 101 (FIG. 1A). The peeling layer 102 refers to a layer which is peeled later. As the peeling layer 102, a metal layer, a stacked-layer structure of a metal layer and a metal oxide film, or the like may be used. The metal layer is formed of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the foregoing element as its main component to have a single-layer structure or a stacked-layer structure. The peeling layer 102 can be formed by sputtering or CVD (Chemical Vapor Deposition). To form the stacked-layer structure of a metal layer and a metal oxide film, oxide of the metal film can be formed on the metal film surface by performing a plasma treatment in an oxygen atmosphere or a heating treatment in an oxygen atmosphere, after the foregoing metal layer is formed. For example, in the case where a tungsten film formed by sputtering is formed as a metal film, a metal oxide film of tungsten oxide can be formed on the tungsten film surface by performing a plasma treatment on the tungsten film. Tungsten oxide is expressed in $WO_x$, and x is 2 to 3. There are cases of x is 2 ($WO_2$), x is 2.5 ($W_2O_5$), x is 2.75 ($W_4O_{11}$), x is 3 ($WO_3$), and the like. When forming tungsten oxide, the values of x described above are not particularly limited, and the oxide to be formed may be decided based on an etching rate or the like. In addition, it is possible to form an oxide film on the metal layer surface by performing a plasma treatment in the condition of high density and a low electron temperature using high frequency (a microwave or the like) (hereinafter the plasma in this condition is also referred to as high-density plasma). High-density plasma has a plasma density of $1\times10^{11}$ cm$^{-3}$ or more, preferably, $1\times10^{11}$ cm$^{-3}$ to $9\times10^{15}$ cm$^{-3}$ and in which high frequency such as a microwave (e.g., a frequency of 2.45 GHz) is used. Plasma generated in such a condition has a low electron temperature of 0.2 to 2.0 eV. Since the high-density plasma which has a feature of low electron temperature has low kinetic energy of activated species, a less defective film with little plasma damage can be formed. Furthermore, in addition to a metal oxide film, metal nitride or metal oxynitride may be used. In this case, a plasma treatment or heating treatment may be performed on the metal film in a nitrogen atmosphere or an atmosphere of nitrogen and oxygen. A condition of the plasma treatment may be set similarly to the foregoing one.

Next, a base layer 103 is formed over the peeling layer 102 (FIG. 1A). The base layer 103 can be formed of an insulating material such as silicon oxide ($SiO_2$), silicon nitride (SiN), or silicon oxynitride to have a single-layer structure or a stacked-layer structure. The base layer 103 is formed to have a stacked-layer structure in this embodiment mode. As a first layer of the base layer 103, a layer of silicon oxynitride is formed by plasma CVD using $SiH_4$, $NH_3$, $N_2O$, and $H_2$ as a reactive gas to have a thickness of 10 to 200 nm (preferably 50 to 100 nm). In this embodiment mode, a silicon oxynitride layer with a thickness of 50 nm is formed as the first layer of the base layer 103. As a second layer of the base layer 103, a layer of silicon oxynitride is formed by plasma CVD using $SiH_4$ and $N_2O$ as a reactive gas to have a thickness of 50 to 200 nm (preferably 100 to 150 nm). In this embodiment mode, a silicon oxynitride layer with a thickness of 100 nm is formed as the second layer of the base layer 103.

Figure 1B:
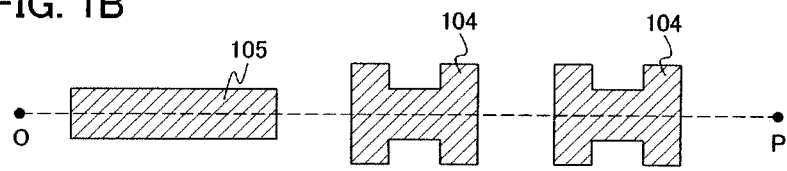
Figure 1C:
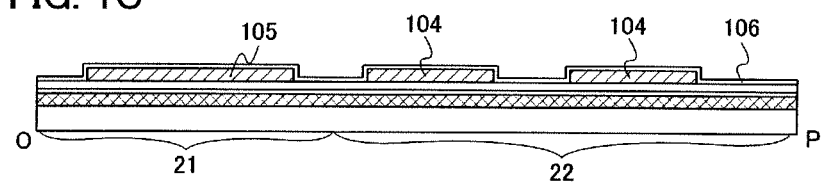

Next, a first structure layer 105 and a semiconductor layer 104 are formed over the base layer 103 in a first region 21 and a second region 22, respectively (a top view of FIG. 1B and a cross-sectional view of FIG. 1C). The semiconductor layer 104 corresponds to an active layer in a semiconductor element and the first structure layer 105 corresponds to a structure layer in a microstructure. Note that the active layer is a semiconductor layer including a channel formation region, a source region, and a drain region. The semiconductor layer 104 and the first structure layer 105 can be formed of a material containing silicon such as a material formed of silicon and a silicon germanium material containing about 0.01 to 4.5 atomic % of germanium. Note that, as the semiconductor layer 104, a semiconductor having a crystalline structure, a microcrystalline structure, or an amorphous structure can be used.

The material and thickness of the first structure layer 105 can be decided in view of various factors such as a structure of the structure and a method for package. For example, when a material having a large difference in distribution of internal stress is used as a material of the first structure layer 105, the first structure layer 105 may curve. However, it is possible to form the structure by utilizing the curve of the first structure layer 105. In addition when the first structure layer 105 is formed to be thick, internal stress may be distributed, which causes a curve or buckling. Therefore, the thickness of the first structure layer 105 is preferably 0.5 to 10 μm.

Next, an insulating layer 106 is formed over the semiconductor layer 104 and the first structure layer 105 (a top view of FIG. 1B and a cross-sectional view of FIG. 1C). The insulating layer 106 serves as a gate insulating layer of a semiconductor element. The insulating layer 106 can be formed of a material containing silicon such as silicon oxide or silicon nitride by plasma CVD, sputtering, or the like, similarly to the base layer 103 and can have a single-layer structure or a stacked-layer structure. In this embodiment mode, a silicon oxynitride film (composition ratio: Si=32%, O=5%, N=7%, and H=2%) is formed to have a thickness of 115 nm by plasma CVD as the insulating layer 106.

Further, as a material of the insulating layer 106, a metal oxide having a high dielectric constant, e.g., hafnium (Hf) oxide can also be used. By using such a high dielectric constant material to form a gate insulating layer, a semiconductor element can be driven at low voltage; thus, a micro-electro-mechanical device with low power consumption can be provided.

Further, the insulating layer 106 can be formed by a high-density plasma treatment. A substrate provided with the semiconductor layer 104 and the first structure layer 105 is installed into a film formation chamber capable of such a plasma treatment, and the distance between an electrode for generating plasma, that is, a so-called antenna, and the object to be treated is set at 20 to 80 mm, and preferably 20 to 60 mm to perform the treatment. Such a high-density plasma treatment allows a low temperature process in which the substrate temperature is 400° C. or less. Accordingly, glass or plastic having low thermostability can be used as the insulating substrate 101.

A film formation atmosphere of such high-density plasma can be a nitrogen atmosphere or an oxygen atmosphere. A nitrogen atmosphere is typically a mixed atmosphere of nitrogen and rare gas, or a mixed atmosphere of nitrogen, hydrogen, and rare gas; in which at least one of helium, neon, argon, krypton, and xenon is used as the rare gas. An oxygen atmosphere is typically a mixed atmosphere of oxygen and rare gas, a mixed atmosphere of oxygen, hydrogen, and rare gas, or a mixed atmosphere of dinitrogen monoxide and rare gas; in which at least one of helium, neon, argon, krypton, and xenon is used as the rare gas.

An insulating layer formed by such a high-density plasma treatment is dense and causes little damage to other films while being formed. Further, the state of an interface to be in contact with the insulating layer can be improved. For example, when the gate insulating layer is formed by a high-density plasma treatment, the state of an interface with the semiconductor layer can be improved. Accordingly, electrical characteristics of the semiconductor element can be improved. In addition, when the insulating layer is formed over the structure layer as described above, damage to the structure layer can be reduced in forming the insulating layer; thereby maintaining strength of the first structure layer 105.

Although the case where a high-density plasma treatment is used for forming the insulating layer 106 is described, the high-density plasma treatment may also be performed to the semiconductor layer. The high-density plasma treatment can modify the surface of the semiconductor layer. Accordingly, electrical characteristics of the semiconductor element can be improved.

In addition, the high-density plasma treatment can be used not only for forming the insulating layer 106 but also for forming the base layer 103 and another insulating layer.

Figure 1D:
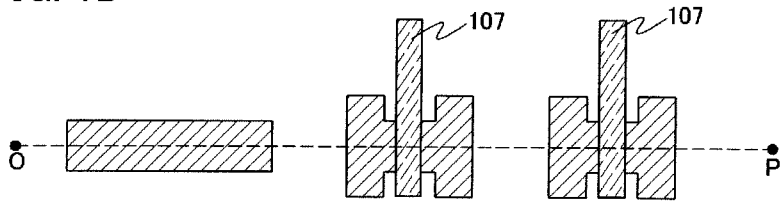
Figure 1E:
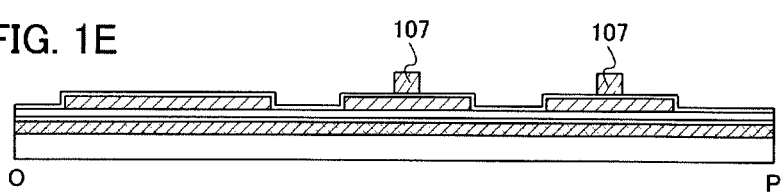

Next, a conductive layer which serves as a gate electrode 107 of the semiconductor element is formed over the insulating layer 106 (a top view of FIG. 1D and a cross-sectional view of FIG. 1E). The conductive layer can be formed by CVD, sputtering, or the like, and processed to have a predetermined shape. The processing of the conductive layer can be performed by patterning of a resist and dry etching using photolithography. Alternatively, the conductive layer can be formed of a composition containing a conductive material by droplet discharging. As the conductive material, a material such as Ag, Au, Cu, Ni, Pt, Pd, Ir, Rh, W, Al, Ta, Mo, Cd, Zn, Fe, Ti, Si, Ge, Zr, or Ba; ITO (indium tin oxide alloy); ITO containing silicon oxide as a composition (also referred to as ITSO); organoindium; organotin; zinc oxide (ZnO); tin nitride (TiN); or the like can be used. In addition, in the case of forming the conductive layer by droplet discharging, a solvent into which the foregoing metal, a dispersive nanoparticle, a silver halide particle, or the like can be used. By employing the droplet discharge method, steps of exposure and development required in photolithography can be omitted. Note that the droplet discharge method is a method also referred to as an ink-jet method, in which a prepared composition is discharged from a nozzle in accordance with an electrical signal to form a minute droplet which is, then, attached on a predetermined position.

An end face of the gate electrode 107 may be etched into a tapered shape. In addition, the gate electrode 107 can be formed to have a single-layer structure or a stacked-layer structure.

Figure 2A:
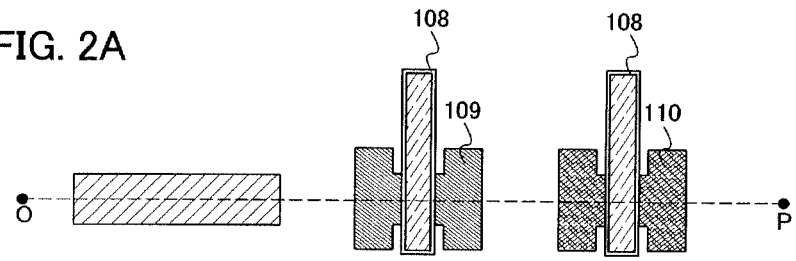
FIGS. 2A to 2D show a manufacturing process for a micro-electro-mechanical device of the present invention.
Figure 2B:
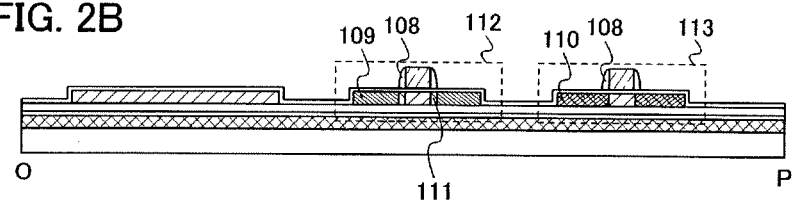

Then, impurity elements are added into the semiconductor layer 104 in the semiconductor element so that an N-type impurity region 111 and a P-type impurity region 110 are formed (a top view of FIG. 2A and a cross-sectional view of FIG. 2B). Such an impurity region can be selectively formed by forming a mask and adding an impurity element using the mask. As a method for adding an impurity element, an ion doping or ion implantation can be employed. As an impurity element which imparts N-type conductivity, phosphorus (P) or arsenic (As) can be typically used and as an impurity element which imparts P-type conductivity, boron (B) can be typically used. It is preferable that respective impurity elements be added into the N-type impurity region 111 and the P-type impurity region 110 at a concentration of $1\times10^{20}$ to $1\times10^{21}/cm^3$.

Next, an insulating layer is formed of a nitride compound such as silicon nitride or oxide such as silicon oxide by plasma CVD or the like, and anisotropicaly etched in a perpendicular direction so that an insulating layer 108 being in contact with the side surface of the gate electrode 107 (hereinafter, referred to as a side wall) is formed (a top view of FIG. 2A and a cross-sectional view of FIG. 2B).

Next, a high-concentration N-type impurity region 109 having impurity concentration higher than that of the N-type impurity region 111 which is formed below the side wall 108 is formed by adding an impurity element to the semiconductor layer 104 including the N-type impurity region 111. The side wall 108 can prevent short-channel effect which is caused when the gate length is shortened. This is because an N-type semiconductor element is more easily affected by short-channel effect. Needless to say, a side wall may be formed and a high-concentration P-type impurity region may be formed in a P-type semiconductor element as well.

In addition, in the case where the gate electrode 107 is formed with a plurality of stacked layers with different conductive materials and has a tapered shape, the N-type impurity region 111 and the high-concentration N-type impurity region 109 can also be formed by adding an impurity element once without providing a side wall.

After the impurity regions are formed, a thermal treatment, infrared light irradiation, or laser irradiation is preferably performed in order to activate the impurity elements. Furthermore, at the same time as the activation, plasma damage to the insulating layer 106 and plasma damage to the interface between the insulating layer 106 and the semiconductor layer 104 can be restored. In particular, effective activation can be performed when the impurity elements are activated using an excimer laser from the front or the back surface in an atmosphere at a temperature ranging from room temperature to 300° C. Further, a higher harmonic such as a second harmonic of a YAG laser may be used for the activation. A YAG laser is preferable to be used for the activation because maintenance of the YAG laser is not so frequently required.

Further, a passivation film of an insulating layer such as a silicon oxynitride film or silicon oxide film may be formed to cover the gate electrode and the semiconductor layer. After that, a thermal treatment, infrared light irradiation, or laser irradiation may be performed to conduct hydrogenation. For example, a silicon oxynitride film is formed as a passivation film by plasma CVD, and then heated using a clean oven at 300 to 550° C. for 1 to 12 hours, thereby hydrogenating the semiconductor layer. By performing this step, dangling bonds in the semiconductor layer which are generated when the impurity elements are added can be terminated by hydrogen contained in the passivation film. At the same time, the activation treatment of the foregoing impurity regions can be performed.

Through the foregoing steps, an N-type semiconductor element 112 and a P-type semiconductor element 113 are formed (a top view of FIG. 2A and a cross-sectional view of FIG. 2B). At this time, an impurity region is formed in the structure layer 105 included in a microstructure. In this embodiment mode, an N-channel thin film transistor and P-channel thin film transistor are employed as an N-type semiconductor element and P-type semiconductor element, respectively.

Subsequently, an insulating layer 114 is formed to cover the entire surface (a top view of FIG. 2C and a cross-sectional view of FIG. 2D). The insulating layer 114 can be formed of an inorganic material having an insulating property or an organic material having an insulating property. As the inorganic material, silicon oxide, or silicon nitride can be used. As the organic material, polyimide, acrylic, polyamide, polyimide amide, a resist, benzocyclobutene, siloxane, or polysilazane can be used. Siloxane includes a skeleton structure formed by a bond of silicon (Si) and oxygen (O). An organic group containing at least hydrogen (such as an alkyl group or aromatic hydrocarbon) is used as a substituent. In addition, a fluoro group may be used as the substituent. Alternatively, a fluoro group and an organic group including at least hydrogen may be used as the substituent. Note that polysilazane is formed using a polymer material having a bond of silicon (Si) and nitrogen (N) as a starting material.

Figure 2C:
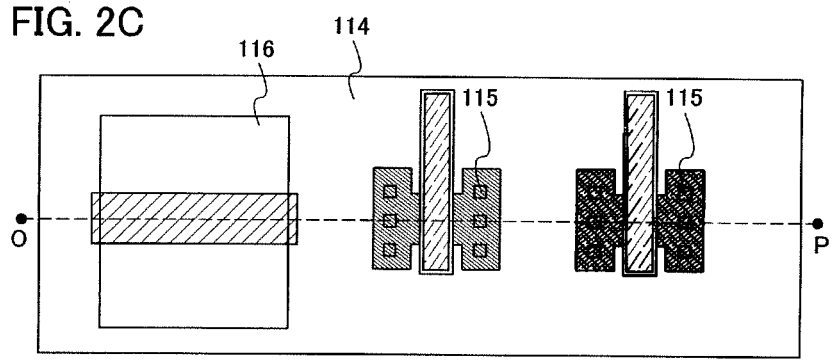
Figure 2D:
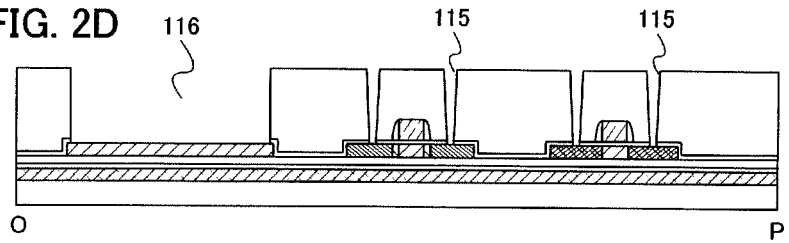

Next, the insulating layers 114 and 106 are etched sequentially to form a contact hole 115 (a top view of FIG. 2C and a cross-sectional view of FIG. 2D). The etching may be dry etching or wet etching. In this embodiment mode the contact hole 115 and an opening 116 are formed by dry etching. The opening 116 is surrounded by the side surface of the contact hole in the insulating layer 114 and the first structure layer 105 exposed by the contact hole.

Here, the opening 116 is a space required for moving a microstructure. Conventionally, the space is formed by etching a sacrifice layer or deeply etching a silicon wafer. In the present invention however, the space is formed by processing an insulating layer which is formed in a manufacturing process of a semiconductor element.

Therefore, the manufacturing process can be simplified, which leads to improvement in production efficiency and reduction in cost.

In addition, an insulating layer may be formrred of a nitride compound such as silicon nitride or oxide such as silicon oxide by plasma CVD on the side surface of the opening 116. Alternatively, a metal layer may be formed by sputtering on the side surface of the opening 116. At that time, an insulating layer or a metal layer is probably formed on the bottom surface of the opening 116 as well. The insulating layer or a metal layer may be etched to be removed, if not necessary. With such a structure, change in pressure in the space of the micro-electro-mechanical device, which is caused due to pressure applied thereto when the micro-electro-mechanical device is driven or gas generated from the insulating layer 114 because of change in temperature of the micro-electro-mechanical device can be prevented.

Figure 3A:
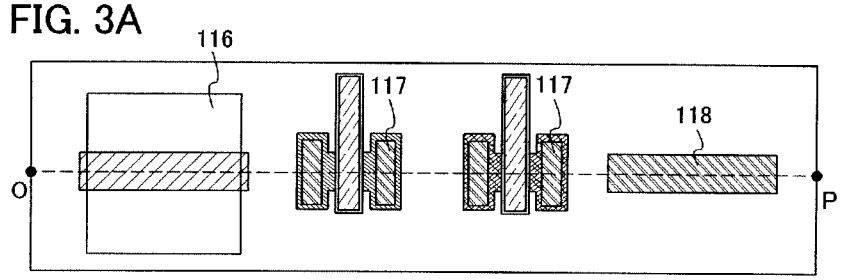
FIGS. 3A to 3D show a manufacturing process for a micro-electro-mechanical device of the present invention.
Figure 3B:
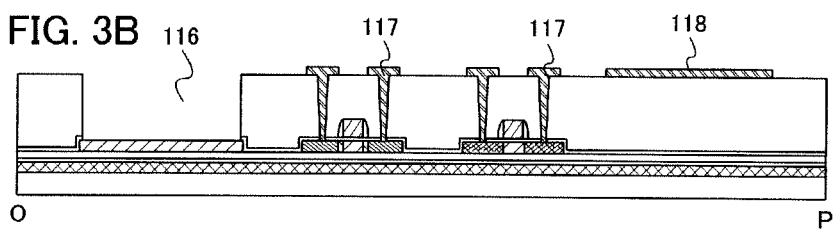

Next, a conductive layer 117, which serves as a source electrode or a drain electrode is formed over the insulating layer 114 and in the contact hole 115. In addition, a second structure layer 118 is formed (a top view of FIG. 3A and a cross-sectional view of FIG. 3B). At this time, a wire included in an electrical circuit can be formed.

The conductive layer 117 and the second structure layer 118 can be formed of aluminum (Al), titanium (Ti), molybdenum (Mo), tungsten (W), or silicon (Si), or a conductive material such as an alloy material using any of the foregoing elements. A composition containing one or a plurality of conductive materials is ejected by droplet discharging to form the second structure layer 118 and the conductive layer 117 which forms a source or drain electrode. Alternatively, the foregoing conductive material by sputtering or CVD may be deposited and then processed into a predetermined shape to form the conductive layer 117 which forms a source or drain electrode. The processing of the conductive material can be performed by patterning of a resist and dry etching using photolithography.

The material and thickness of the second strucuture layer 118 can be decided in consideration of various factors such as a structure of the structure and a method for package. The second structure layer 118 is preferably formed to have a thickness of 0.5 to 10 μm.

In addition, when the source electrode and the drain electrode have a pattern with a corner when seen from the top, they are preferably etched so that the corner is round. Accordingly, occurrence of dust can be suppressed, thus the yield can be improved. This is similarly applied to the case of etching a conductive layer such as the gate electrode 107.

Figure 3C:
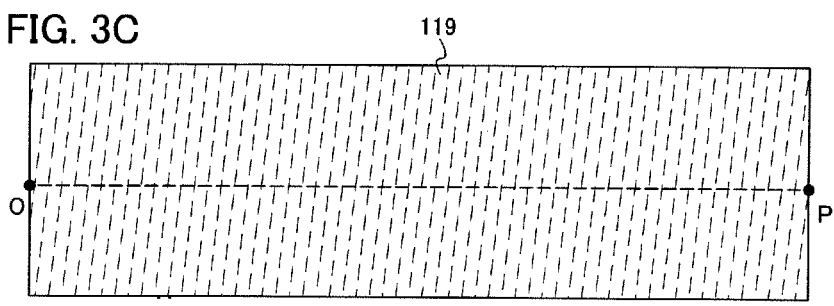
Figure 3D:
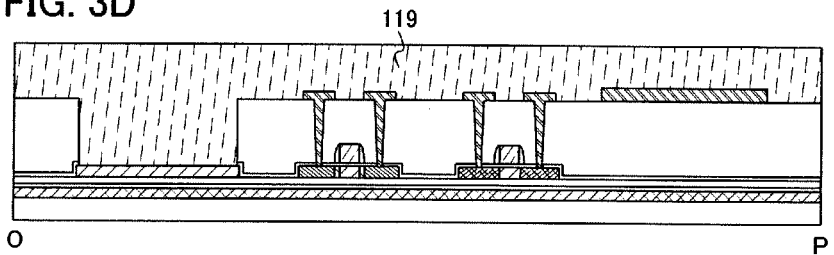

Next, an insulating layer 119 serving as a protective film is formed by SOG (Spin On Glass), droplet discharging, or the like so as to cover a semiconductor element portion (a top view of FIG. 3C and a cross-sectional view of FIG. 3D). The insulating layer 119 can be formed of an inorganic material or an organic material. For example, the insulating layer 119 is formed with a film containing carbon such as DLC (Diamond Like Carbon), a film containing silicon nitride, a film containing silicon nitride oxide, an epoxy resin, or the like. Since the insulating layer 119 is thick, an organic material such as an epoxy resin is preferably used so that the insulating layer 119 does not lose its flexibility. The insulating layer can be formed to have a single-layer structure or a stacked-layer structure. In the case of a stacked-layer structure, an inorganic material and an organic material are preferably stacked alternately.

Figure 4A:
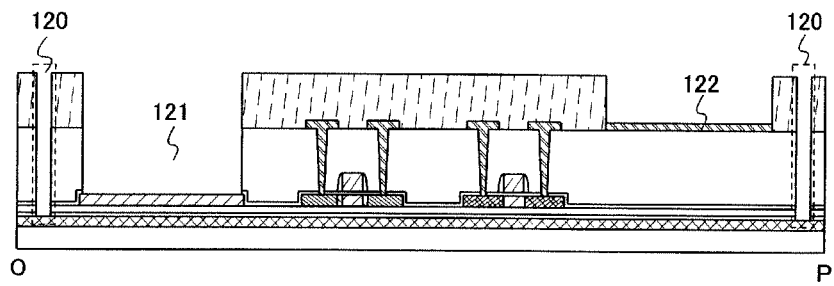
FIGS. 4A to 4C show a manufacturing process for a micro-electro-mechanical device of the present invention.

Then, the peeling layer 102 is exposed by processing the insulating layers 114 and 119 by photolithography or laser light irradiation to form an opening 120 for peeling the peeling layer 102. In addition, openings 121 and 122 are formed so that the first structure layer 105 and the second structure layer 118 are exposed, respectively (FIG. 4A). The openings 121 and 122 can be formed by etching or laser irradiation simultaneously or sequentially.

Figure 4B:
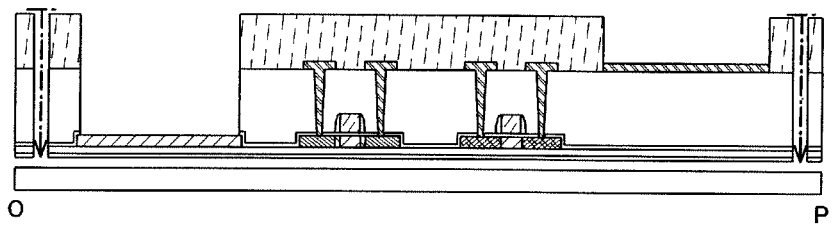
Figure 4C:
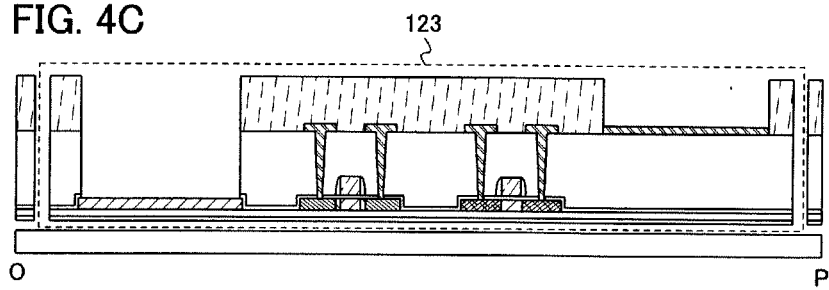

Then, the peeling layer 102 is removed by pouring an etchant into the opening 120 (FIG. 4B). As the etchant, a gas or a liquid containing halogen fluoride or a halogen compound is used. For example, the peeling layer 102 is removed by using chlorine trifluoride ($ClF_3$) as the gas containing halogen fluoride. Accordingly, a micro-electro-mechanical device forming portion 123 is separated from the insulating substrate 101 (FIG. 4C). Note that the micro-electro-mechanical device forming portion includes a region in which a functional element is formed. The peeling layer 102 may be partially left without being removed entirely. By leaving a part of the peeling layer 102, consumption of the etchant is suppressed and time taken for removing the peeling layer can be shortened. In addition, by leaving a part of the peeling layer 102, the micro-electro-mechanical device forming portion 123 can be kept over the insulating substrate 101 after removing the peeling layer 102.

It is preferable to reuse the insulating substrate 101 after the micro-electro-mechanical device forming portion 123 is separated for reducing the cost. In addition, the insulating layer 119 is formed to prevent the micro-electro-mechanical device forming portion 123 from scattering after the peeling layer 102 is removed. After the peeling layer 102 is removed, the micro-electro-mechanical device forming portion 123, which is small, thin, and light, easily scatters since it is not attached firmly to the insulating substrate 101. However, by forming the insulating layer 119 over the micro-electro-mechanical device forming portion 123, the micro-electro-mechanical device forming portion 123 receives weight and scattering thereof from the insulating substrate 101 can be prevented. In addition, by forming the insulating layer 119, the micro-electro-mechanical device forming portion 123 which is thin and light is not rolled due to stress after being separated from the insulating substrate 101, and the strength thereof can be ensured to a certain extent.

Figure 5A:
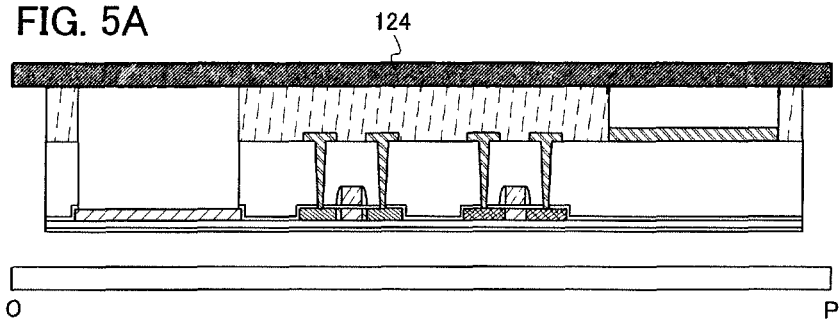
FIGS. 5A to 5C show a manufacturing process for a micro-electro-mechanical device of the present invention.

Subsequently, one surface of the micro-electro-mechanical device forming portion 123 is attached to a first sheet member 124, and completely separated from the insulating substrate 101 (FIG. 5A). In the case where a part or the peeling layer 102 is left without being removed entirely, the micro-electro-mechanical device forming portion 123 is separated from the insulating substrate 101 by physical means.

In the above step, when adhesion between the micro-electro-mechanical device forming portion 123 and the peeling layer 102 is weak, the step of removing the peeling layer 102 may be omitted and the micro-electro-mechanical device forming portion 123 can be separated from the insulating substrate 101 by physical means.

Figure 5B:
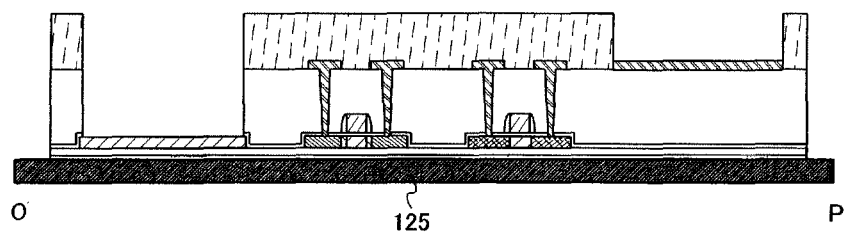

Next, a second sheet member 125 is provided to the other surface of the micro-electro-mechanical device forming portion 123 and either or both heat treatment and pressure treatment is performed so that the second sheet member 125 adheres thereto. This step is referred to as transfer to the second sheet member 125. Upon providing or after providing the second sheet member 125, the first sheet member 124 is separated (FIG. 5B). The second sheet member 125 is formed of an organic material with high flexibility such as acrylic. Such a sheet is referred to as a resin substrate (flexible substrate) as well.

Figure 5C:
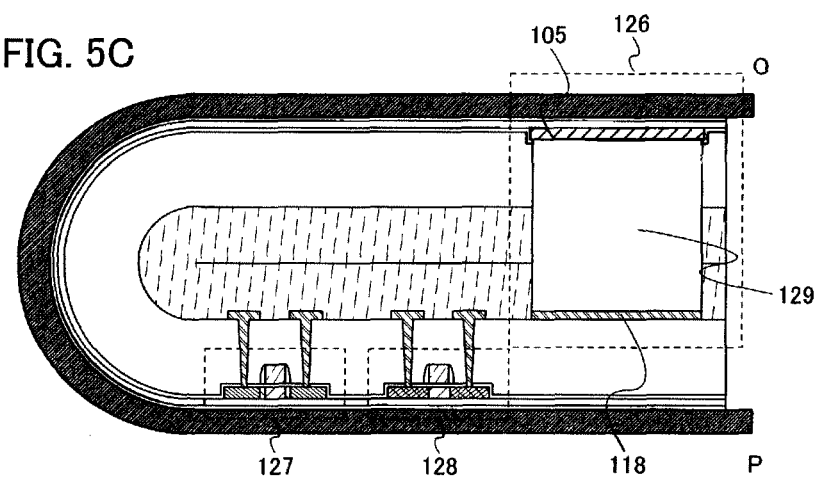

Then, the second sheet member 125 is folded so that the first structure layer 105 formed in the first region and the second structure layer 118 formed in the second region, in the micro-electro-mechanical device forming portion 123 formed over the second sheet member 125, face each other and are sealed so as to be overlapped each other at least partially (FIG. 5C). By performing such a step, a space 129 is generated. That is, the space 129 is formed by the openings 121 and 122 which are opposite to each other. At this time, in a region other than the openings 121 and 122, the insulating layer 119 is folded so that the surface thereof comes into contact; therefore, it is preferable that the insulating layer 119 have an adhesion property. In addition, the insulating layer 119 is preferably formed of an organic material in order to reduce the impact of being folded. When an organic material is used for the insulating layer 119, the film thickness can be thick compared with when an inorganic material is used. Further, since an organic material has low hardness, the impact after completion of the product can be also reduced.

In addition, the space 129 may be closed by being sealed or may be opened. When the space is closed, a reference pressure is sealed therein and the space can be used as a pressure sensor.

In the present invention, since the microstructure is folded to form a space, the semiconductor element is formed in a region where the curvature radius is none or the curvature is large, in consideration of a material of the insulating substrate. That is, the semiconductor elements are formed in a region in which the semiconductor element can be driven when the microstructure is folded.

Thus, the microstructure 126 and the semiconductor elements 127 and 128 are formed over one surface (FIG. 5C). By manufacturing the microstructure and the semiconductor element over one surface and simplifying the steps of forming the space for moving the microstructure and of packaging the microstructure and semiconductor element, a micro-electro-mechanical device with low manufacturing cost and improved production efficiency can be provided.

A micro-electro-mechanical device including a microstructure of this embodiment mode can be applied to a sensor, a memory, a fractionation device, a discharge device, or a pressure sensor, which are described in following embodiment modes. Needless to say, the microstructure can be employed as a minute pump such as a gas component suction device without being limited to a discharge device.

In addition, a structure may be employed, in which a micro-electro-mechanical device is covered with a film or the like to be protected in accordance with a type of the micro-electro-mechanical device and the intended purpose.

Embodiment Mode 2

In this embodiment mode, a semiconductor layer having a crystalline structure, a microcrystalline structure, or an amorphous structure can be applied to the structure layer. In this embodiment mode, the case where polycrystalline silicon is used for the structure layer is described. Note that the structure layer may have a stacked-layer structure. When polycrystalline silicon is used for such a structure layer, polycrystalline silicon may be contained any of the layers. The structure layer can be also referred to as a layer containing polycrystalline silicon. Similarly, in the case of amorphous silicon, the structure layer can be also referred to as a layer containing amorphous silicon.

First, an amorphous silicon layer is formed over a surface for forming a structure layer. Then a thermal treatment is performed to crystallize the amorphous silicon layer, thereby a polycrystalline silicon layer can be obtained. A heating furnace, laser irradiation, irradiation with light emitted from a lamp in stead of laser light (hereinafter referred to as lamp annealing), or a combination thereof can be employed as the thermal treatment.

A continuous wave laser beam (hereinafter referred to as a CW laser beam) or a pulsed wave laser beam (hereinafter referred to as a pulsed laser beam) can be used in the case of the laser irradiation. One of or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. Crystals having a large grain size can be obtained by irradiation with a laser beam of a fundamental wave of the above laser beam or a second harmonic to a fourth harmonic of the fundamental wave. For example, a second harmonic (532 nm) or a third harmonic (355 nm) of an Nd:$YVO_4$ laser (fundamental wave: 1064 nm) can be used. Energy density of the laser at this time needs to be about 0.01 to 100 MW/cm² (preferably, 0.1 MW/cm² to 10 MW/cm²). The laser irradiation is performed at scanning speed of about 10 to 2000 cm/sec.

Note that the amorphous silicon layer may be irradiated with a continuous wave laser beam at a fundamental wave and a continuous wave laser beam at a higher harmonic, or may be irradiated with a continuous wave laser beam at a fundamental wave and a pulsed wave laser beam at a higher harmonic. Energy can be supplemented by irradiation with plural kinds of laser beams.

Further, in the case of a pulsed wave laser, pulsed laser may be oscillated with such a repetition rate that the laser of the next pulse is emitted until the semiconductor film is solidified after the semiconductor film is melted. By oscillating the laser beam with such a repetition rate, crystal grains that are continuously grown in the scanning direction can be obtained. Specifically, a laser beam with a repetition rate of 10 MHz or more is used, which is much higher than the repetition rate band of several tens to several hundreds Hz which is normally used.

Alternatively, in the case of using a heating furnace for the thermal treatment, the amorphous silicon layer is heated at a temperature of 400 to 550° C. for 2 to 20 hours. At this time, the temperature may be set in stages in the range of 400 to 550° C. so as to be gradually increased. Since hydrogen or the like of the amorphous silicon layer is released by the first low-temperature heating step at about 400° C., film roughness in crystallization can be reduced.

In addition, a metal element which promotes crystallization, e.g., Ni, may be formed over the amorphous silicon layer, which is preferable in that the heat temperature can be lowered. As the metal element, Fe, Ru, Rh, Pd, Os, Ir, Pt, Cu, Au, or the like can also be used.

Further, in addition to the thermal treatment, irradiation with the foregoing laser beam may be performed to form the polycrystalline silicon layer.

Polycrystalline silicon which has been crystallized using such a metal can have higher tenacity than polycrystalline silicon which is formed by crystallization without a metal. This is because crystal grain boundaries of polycrystalline silicon become continuous due to the crystallization using a metal. The polycrystalline silicon in which crystal grain boundaries are continuous has such a structure that covalent bonds are not broken at grain boundaries, unlike polycrystalline silicon obtained by crystallization without a metal.

Accordingly, stress concentration which is caused by defects due to grain boundaries does not occur. As a result, fracture stress becomes higher than that of the polycrystalline silicon formed by crystallization without a metal.

Polycrystalline silicon where crystal grain boundaries are continuous has high-electron mobility, which is suitable as the material in the case where a microstructure is controlled by electrostatic force e.g., electrostatic attractive force. Furthermore, the structure layer contains a metal element which promotes crystallization and has a conductive property; therefore, it is suitable for a micro-electro-mechanical device of the present invention in which a structure is controlled by electrostatic force. Needless to say, a polycrystalline silicon layer may be applied to the structure layer in the case where the microstructure is controlled by electromagnetic force.

In addition, when nickel is used as the metal, nickel silicide may be formed depending on the concentration of nickel. It is generally known that a silicon alloy such as nickel silicide exhibits high mechanical strength. Therefore, by leaving the metal used in the thermal treatment in the entire or a part of the silicon layer and applying appropriate thermal treatment, a microstructure with higher hardness and a higher conductive property can be formed.

The layer having nickel silicide in which the metal used in the foregoing crystallization is left (nickel silicide layer) and a polycrystalline silicon layer are stacked, thereby obtaining a structure layer which is superior in the conductive property and is flexible. It is generally known that a silicon alloy such as nickel silicide exhibits high mechanical strength. Therefore, by leaving the metal used in the crystallization of the semiconductor layer entirely of partially in the semiconductor layer and applying appropriate thermal treatment, a structure with higher hardness and a higher conductive property can be formed. By stacking a nickel silicide layer and an amorphous silicon layer, a hard material which is superior in the conductive property can be obtained.

Such a silicide layer can also be formed of tungsten, titanium, molybdenum, tantalum, cobalt, or platinum as well as nickel, which correspond to a tungsten silicide layer, a titanium silicide layer, a molybdenum silicide layer, a tantalum silicide layer, a cobalt silicide layer, and a platinum silicide layer, respectively. Among them, cobalt or platinum can also be used as a metal for reducing the heat temperature.

However, since the metal for promoting crystallization is a contaminant for a micro-electro-mechanical device, it can be removed after the crystallization. In this case, after crystallization by thermal treatment or laser irradiation, a layer to be a gettering sink is formed over the silicon layer and heated, thereby moving the metal element into the gettering sink. A semiconductor layer into which an impurity is added or a polycrystalline semiconductor layer can be used as the gettering sink. For example, an amorphous semiconductor layer into which an inert element such as argon is added and which is formed over the semiconductor layer may be used as a gettering sink. By adding an inert element, distortion can be generated in the amorphous semiconductor layer, and a metal element can be efficiently captured by the distortion. Alternatively, the metal can be captured by forming a semiconductor layer into which another element such as phosphorus is added.

In the case where a conductive property is required for the structure layer, an impurity element such as phosphorus, arsenic, or boron can also be added after the metal is removed. A structure having a conductive property is suitable for a micro-electro-mechanical device of the present invention which is controlled by electrostatic force. Note that the metal may be left in the structure layer without being removed.

The structure layer may have a stacked-layer structure in order to obtain a required thickness. For example, a polycrystalline silicon layer can be formed to have a stacked-layer structure by repeating formation of an amorphous silicon layer and crystallization by thermal treatment. By this thermal treatment, a stress in the polycrystalline silicon layer which has been formed before is suppressed; thereby peeling of a film and deformation of the substrate can be prevented. Further, in order to further suppress the stress in the film, etching of the silicon layer may also be included in the repeated steps. Such a forming method including etching is suitable for the case where a material having a large internal stress is used for the structure layer.

In the case where crystallization is performed by using a metal as described above, the crystallization can be performed at a low temperature compared with crystallization without a metal, therefore, more kinds of materials can be given as a material for a substrate included in a microstructure. For example, in the case where the semiconductor layer is crystallized only by heat, it is required that the layer is heated at about 1000° C. for about one hour, thus a glass substrate which is weak in heat cannot be used. However, by performing crystallization using the foregoing metal as in this embodiment mode, a glass substrate with a distortion point of 593° C. can be used.

In cristallization using a metal as the foregoing step, a partial crystallization can be performed as well by selectively applying (adding) the metal.

In such crystallization, partial crystallization can be performed by change in a laser condition and partial irradiation.

Various combinations of materials can be obtained by the foregoing partial crystallization. For example, only a portion which is driven frequency may be crystallized to increase tenacity.

Note that a polycrystalline silicon layer can be simiraly used for the second structure layer 118.

This embodiment mode can be freely combined with the foregoing embodiment modes.

Embodiment Mode 3

In the present invention, silicon or silicon compounds having various properties can be stacked for the structure layer. Silicon layers having various properties are different in properties such as strength depending on the crystalline structure which is selected from an amorphous structure, microcrystalline structure, polycrystalline structure, or the like. Further, in the case of polycrystalline structure, a silicon layer thereof is different in properties due to the crystal direction. In this embodiment mode, an example of a stacked-layer structure used for the structure layer is described.

Figure 6:
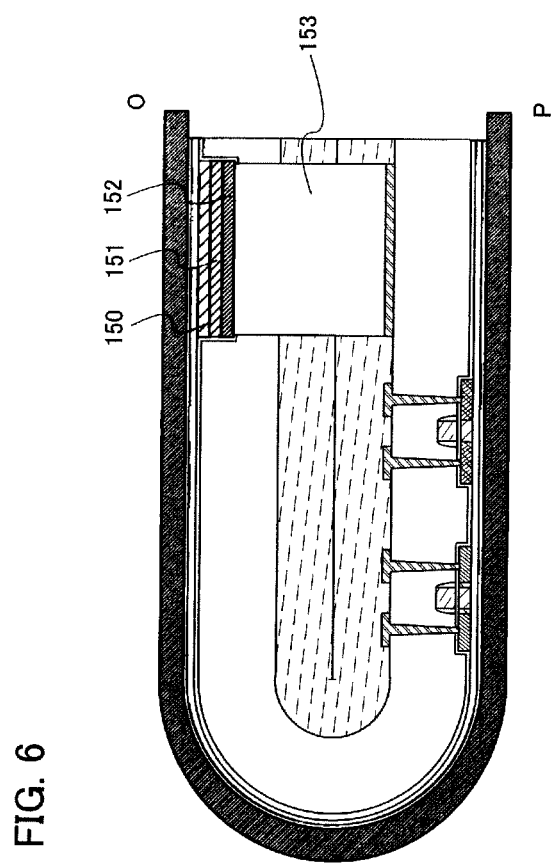
FIG. 6 shows a manufacturing process for a micro-electro-mechanical device of the present invention.

As shown in FIG. 6, silicon and silicon compounds which are different from each other in properties can be stacked. FIG. 6 shows the case where an amorphous silicon layer 150, a polycrystalline silicon layer 151, and a nickel silicide layer 152 are stacked as the structure layer 118 to form a space 153. Thus, by stacking layers different in mechanical properties, the structure layer 118 as needed can be obtained.

In addition, the space 153 is formed by two openings opposite to each other like the above embodiment modes. At this time, in a region other than the openings, the insulating layer is folded so that the surface thereof comes into contact; therefore, it is preferable that the insulating layer have an adhesion property. In addition, when the insulating layer is formed of an organic material, impact of being folded and the impact after completion of the product can be also reduced.

In addition, the space 153 may be closed by being sealed or may be opened. When the space is closed, a reference pressure is sealed therein and the space can be used as a pressure sensor.

As a layer for the structure, etching may be performed after stacking all the layers or every time a film is formed. Thus, the structure layer 118 having a required property can be easily formed.

Note that balance between flexibility and hardness can be determined by a ratio of respective thicknesses of the stacked layers. This is because destruction, which occurs from dangling bonds in the amorphous silicon layer, would be stopped by a polycrystalline silicon layer because the polycrystalline silicon layer having a high crystalline property does not propagate destruction easily. Therefore, the amorphous silicon layer can be formed to be relatively thick and the polycrystalline silicon layer can be formed to be relatively thin.

Further, crystal growth of silicon proceeds in a perpendicular direction with respect to a substrate when laser crystallization is performed using a metal, whereas crystal growth of silicon proceeds in a parallel direction with respect to a substrate when laser crystallization is performed without a metal. By stacking layers formed by both kinds of the laser crystallization, a material which is further superior in tenacity can be obtained. Since layers having different crystal directions are stacked, if a crack or the like occurs in one layer, the crack is not easily propagated to another layer having a different crystal direction; accordingly, the structure layer with high strength can be formed.

The amorphous silicon layer, the polycrystalline silicon layer, or the nickel silicide containing layer as described above can also be stacked by repeating film formation, in order to provide a necessary thickness. For example, formation of the amorphous silicon layer and heating may be repeated. Alternatively, etching of the silicon layer may also be included in the repeated steps in order to suppress the stress in the film; in this case, formation, heating, and patterning of the amorphous silicon layer are repeatedly performed. As a result peeling of the amorphous silicon layer formed over the insulating substrate can be prevented. The film formation and the crystallization can be combined by freely selecting among the foregoing examples.

By stacking semiconductor layers as described above, a structure layer having both flexibility and hardness can be obtained.

Note that similar stacked-layer structure can be applied to the second structure layer 118.

This embodiment mode can be freely combined with the foregoing embodiment modes.

Embodiment Mode 4

In this embodiment mode, a method in which micro-electro-mechanical devices formed over one substrate are assembled is described.

Figure 7A:
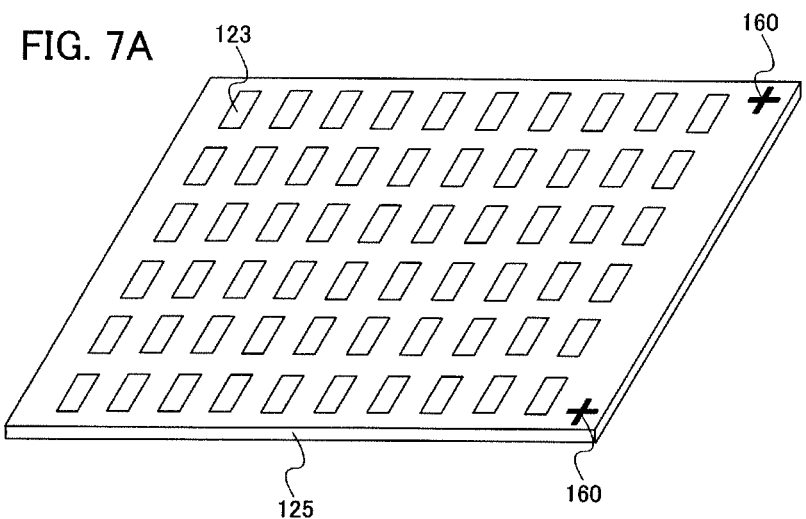
FIGS. 7A and 7B show an assembling process for a micro-electro-mechanical device of the present invention.

A mark for alignment 160 is provided in advance over the second sheet member 125 where the micro-electro-mechanical device forming portion 123 is formed (FIG. 7A).

Figure 7B:
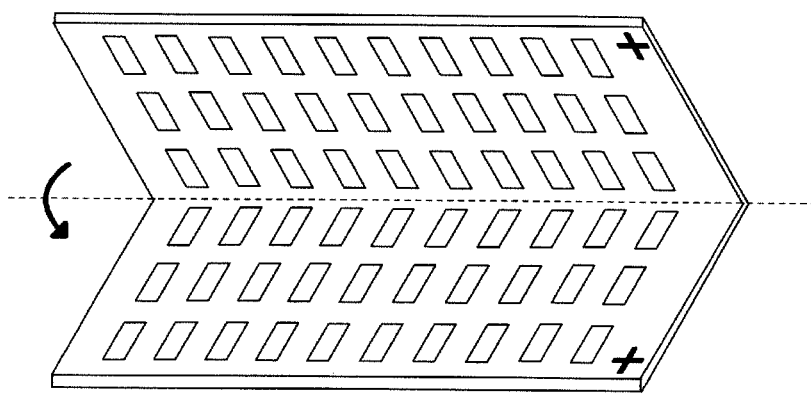

Then, the second sheet member 125 is folded by physical means with reference to the mark for alignment 160 (FIG. 7B). With this step, a microstructure with a space for moving the microstructure and a semiconductor element for controlling the microstructure as shown in FIG. 5C can be assembeld.

Although in FIGS. 7A and 7B, an example where the second sheet member 125 is folded in half with reference to the mark for alignment 160 along a central line; a type, a shape, a size, a number, and a place of the mark for alignment are appropriately selected. A folding pattern of the sheet member can be appropriately chosen.

In addition, the micro-electro-mechanical device forming portion can be assembled by using different means from described above. For example, the second sheet member 125 is cut out with the micro-electro-mechanical device forming portion 123 as a minimum unit (FIG. 8A).

Figure 8A:
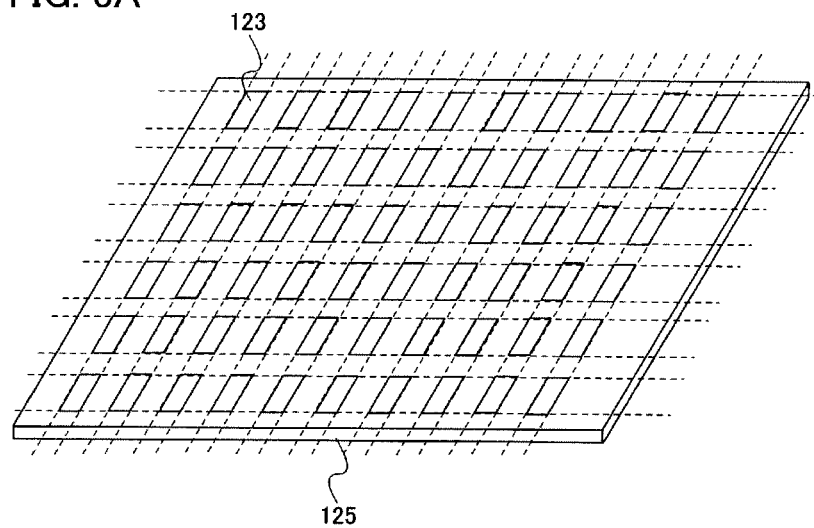
FIGS. 8A and 8B show an assembling process for a micro-electro-mechanical device of the present invention.
Figure 8B:
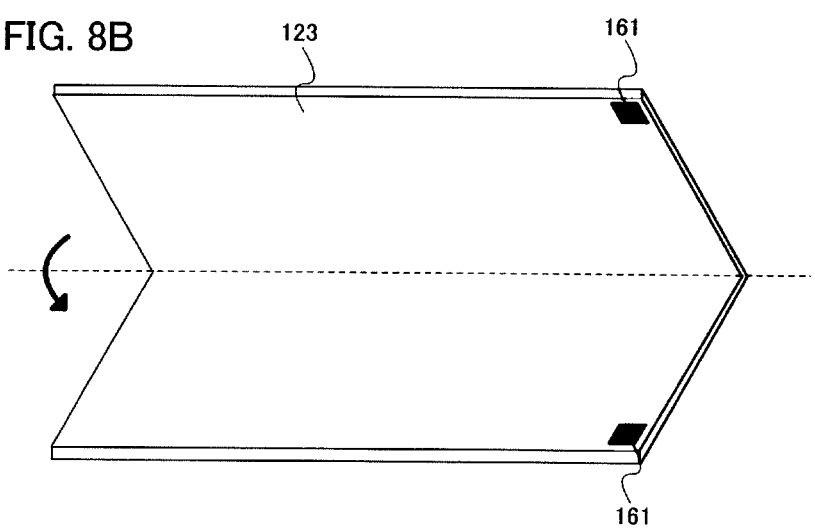

Then, the cut micro-electro-mechanical device forming portion 123 is folded reference to the mark for alignment 161 provided in advance (FIG. 8B). With this step, a microstructure with a space for moving the microstructure and a semiconductor element for controlling the microstructure as shown in FIG. 5C can be assembeld.

Although in FIGS. 8A and 8B, an example where the micro-electro-mechanical device forming portion 123 is folded in half with reference to the mark for alignment 161 along a central line; a type, a shape, a size, a number, and a place of the mark for alignment are appropriately selected. A folding pattern of the micro-electro-mechanical device forming portion can be appropriately chosen.

Although in FIGS. 8A and 8B, an example where the minimum unit to be cut out is one of the micro-electro-mechanical device forming portions 123 is shown, the minimum unit to be cut out may be a plurality of the micro-electro-mechanical device forming portions 123.

In this embodiment mode, a groove can be preformed in a border with which the micro-electro-mechanical device forming portion is folded. The groove can be formed by physical means such as laser scribing or a cutter, chemical means utilizing chemical reaction, or the like. In that case, a mark for alignment is not necessarily provided because the groove can serve as a fiducial mark.

Embodiment Mode 5

In this embodiment mode, a method for forming a microstructure and a semiconductor element over one surface, which is different from that of Embodiment Mode 1 is described with reference to the drawings. In the drawings, top views and cross-sectional views taken along a line O-P are shown.

Figure 9A:
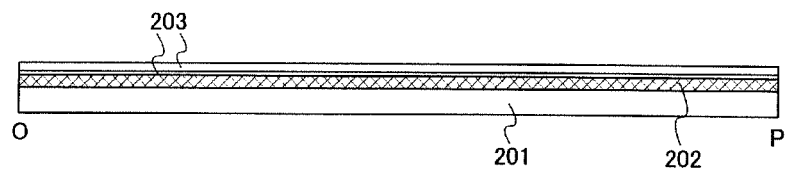
FIGS. 9A to 9E show a manufacturing process for a micro-electro-mechanical device of the present invention.

First, a peeling layer 202 is formed over an insulating substrate 201 and a base layer 203 is formed thereover like Embodiment Mode 1 (FIG. 9A).

Figure 9B:
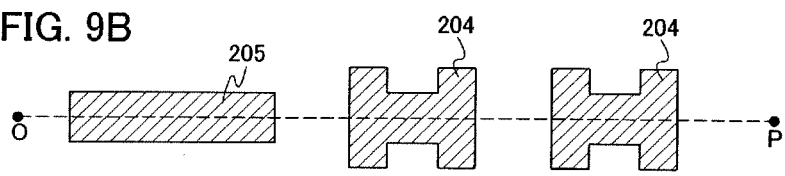
Figure 9C:
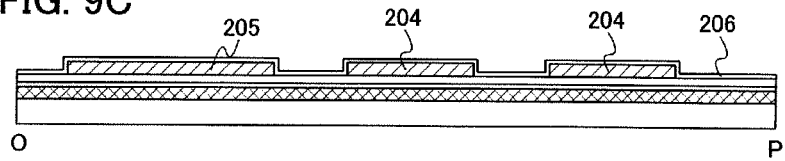

A semiconductor layer 204 and a first structure layer 205 are formed over the base film 203 (a top view of FIG. 9B and a cross-sectional view of FIG. 9C). The semiconductor layer 204 and the first structure layer 205 can be formed similarly to Embodiment Mode 1. In addition, as the semiconductor layer 204 and the first structure layer 205, a silicon layer having a crystalline structure, a microcrystalline structure, or an amorphous structure can be used.

Next, an insulating layer 206 is formed over the semiconductor layer 204 and the first structure layer 205 (a top view of FIG. 9B and a cross-sectional view of FIG. 9C). The insulating layer 206 serves as a gate insulating layer of a semiconductor element. Similarly to Embodiment Mode 1, the insulating layers and the like can be formed by high-density plasma.

Figure 9D:
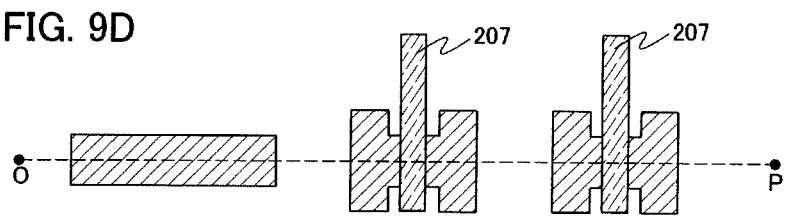
Figure 9E:
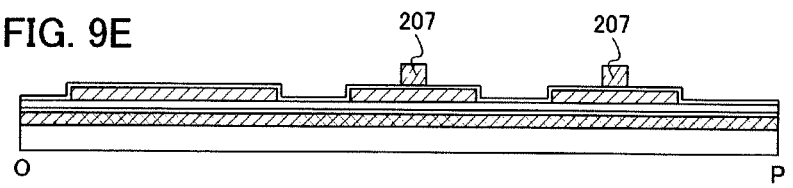

Similarly to Embodiment Mode 1, a conductive layer is formed over the insulating layer 206 to form a gate electrode 207 of the semiconductor element (a top view of FIG. 9D and a cross-sectional view of FIG. 9E).

Figure 10A:
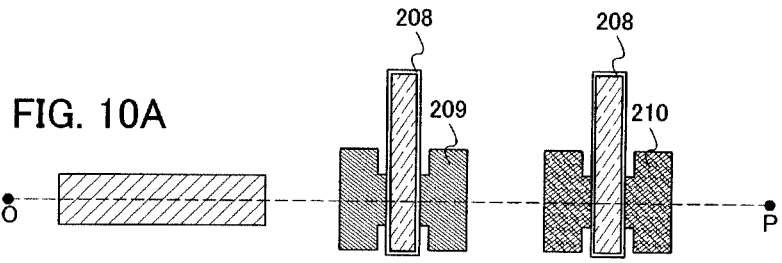
FIGS. 10A to 10D show a manufacturing process for a micro-electro-mechanical device of the present invention.
Figure 10B:
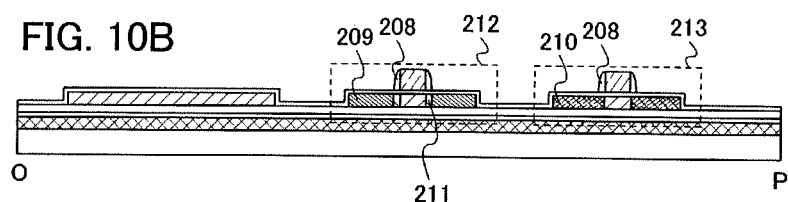

Then, similarly to Embodiment Mode 1, impurity elements are added into the semiconductor layer 204 in the semiconductor element so that an N-type impurity region 211 and a P-type impurity region 210 are formed (a top view of FIG. 10A and a cross-sectional view of FIG. 10B).

Next, an insulating layer is formed of a nitride compound such as silicon nitride or oxide such as silicon oxide by plasma CVD or the like, and anisotropicaly etched in a perpendicular direction so that an insulating layer being in contact with the side surface of the gate electrode 207, that is, a side wall 208 is formed (a top view of FIG. 10A and a cross-sectional view of FIG. 10B). The side wall 208 can prevent short-channel effect which is caused when the gate length is shortened.

Next, a high-concentration N-type impurity region 209 having impurity concentration higher than that of the N-type impurity region 211 which is formed below the side wall 208 is formed by adding an impurity element to the semiconductor layer 204 including the N-type impurity region 211. With this step, an N-type semiconductor element 212 and a P-type semiconductor element 213 can be formed (a top view of FIG. 10A and a cross-sectional view of FIG. 10B). At this time, an impurity region is also formed in the first structure layer 205 included in the microstructure.

Subsequently, an insulating layer 214 is formed to cover the entire surface (a top view of FIG. 10C and a cross-sectional view of FIG. 10D). Then, the insulating layer 214 can be formed of an inorganic material having an insulating property, an organic material having an insulating property, or the like.

Figure 10C:
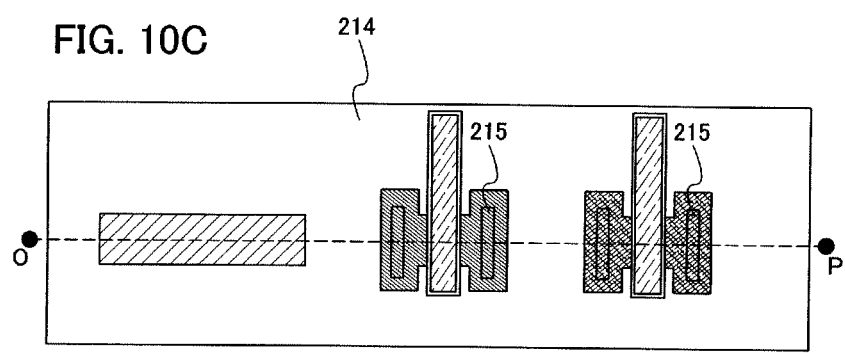
Figure 10D:
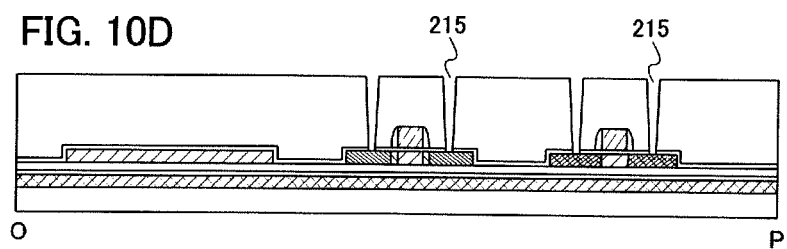

Next, the insulating layers 214 and 206 are etched sequentially to form a contact hole 215 (a top view of FIG. 10C and a cross-sectional view of FIG. 10D). The etching may be dry etching or wet etching. In this embodiment mode the contact hole 215 is formed by dry etching.

Figure 11A:
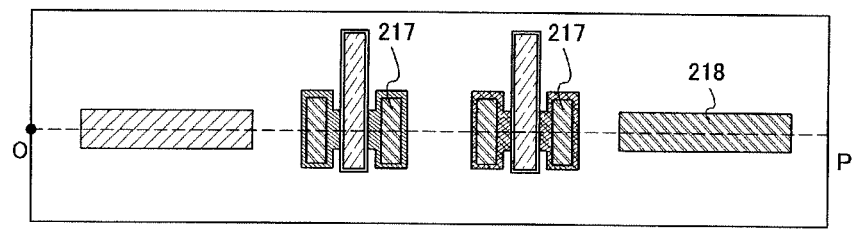
FIGS. 11A to 11D show a manufacturing process for a micro-electro-mechanical device of the present invention.
Figure 11B:
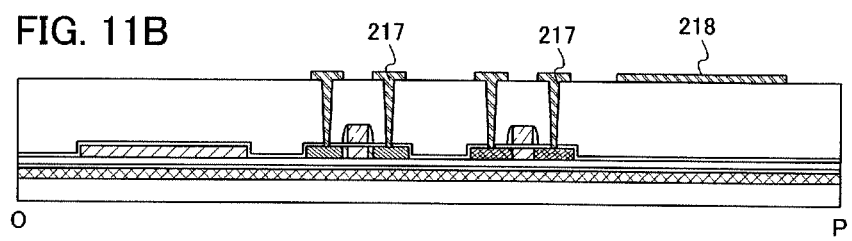

Next, a conductive layer, which serves as a source electrode or a drain electrode 217, is formed over the insulating layer 214 and in the contact hole 215. In addition, a second structure layer 218 is formed (a top view of FIG. 11A and a cross-sectional view of FIG. 11B). In this time, a wire included in an electrical circuit can be formed.

Figure 11C:
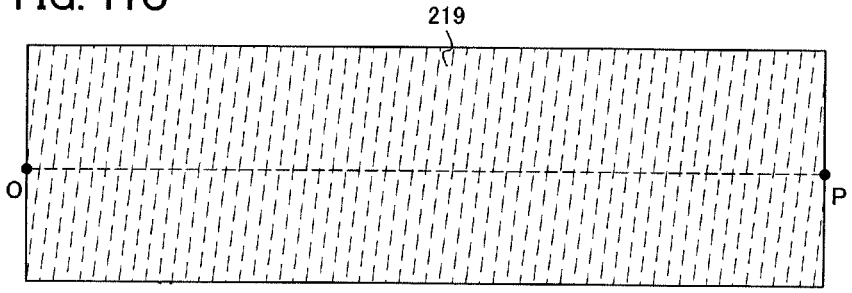
Figure 11D:
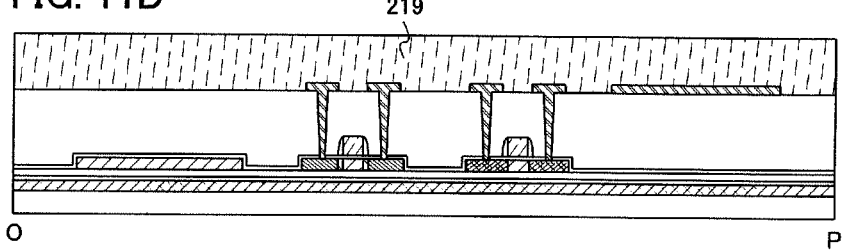

Next, an insulating layer 219 serving as a protective film is formed by SOG, droplet discharging, or the like so as to cover a semiconductor element portion (a top view of FIG. 11C and a cross-sectional view of FIG. 11D). The insulating layer 219 can be formed of an inorganic material or an organic material. For example, the insulating layer 219 is formed with a film containing carbon such as DLC (Diamond Like Carbon), a film containing silicon nitride, a film containing silicon nitride oxide, an epoxy resin, or the like. Since the insulating layer 219 is thick, an organic material such as an epoxy resin is preferably used so that the insulating layer 219 does not lose its flexibility. The insulating layer 219 can be formed to have a single-layer structure or a stacked-layer structure. In the case of a stacked-layer structure, an inorganic material and an organic material are preferably stacked alternately.

Figure 12A:
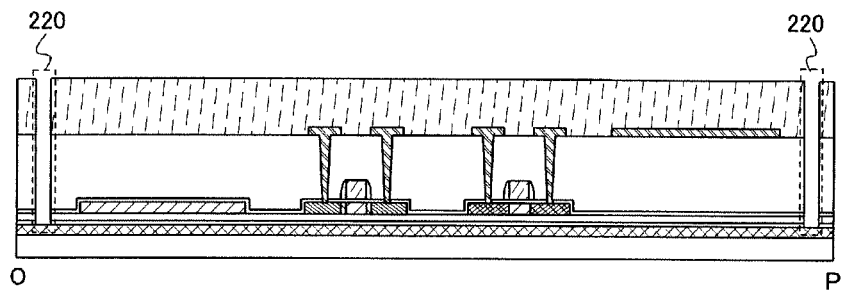
FIGS. 12A to 12C show a manufacturing process for a micro-electro-mechanical device of the present invention.

Then, the peeling layer 202 is exposed by processing the insulating layer by photolithography or laser light irradiation to form an opening 220 for peeling the peeling layer 202 (FIG. 12A).

Figure 12B:
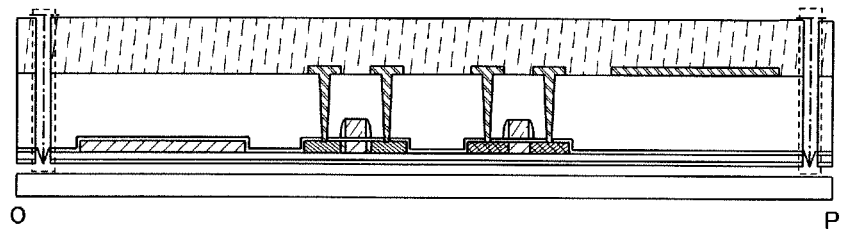
Figure 12C:
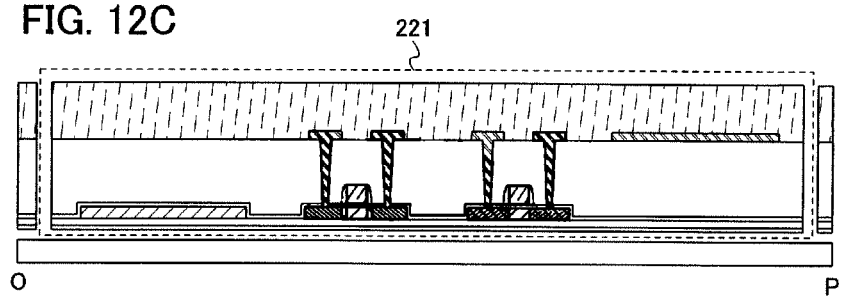

Then, the peeling layer 202 is removed by pouring an etchant into the opening 220 (FIG. 12B). As the etchant, a gas or a liquid containing halogen fluoride or a halogen compound is used. When the etchant is poured, a micro-electromechanical device forming portion 221 is separated from the insulating substrate 201 (FIG. 12C).

Figure 13A:
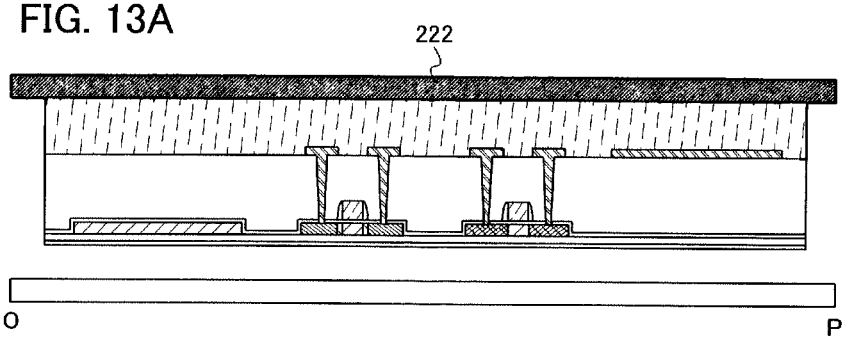
FIGS. 13A to 13C show a manufacturing process for a micro-electro-mechanical device of the present invention.

Subsequently, one surface of the micro-electro-mechanical device forming portion 221 is attached to a first sheet member 222, and completely separated from the substrate 201 (FIG. 13A). In the case where a part of the peeling layer 202 is left without being removed entirely, the micro-electro-mechanical device forming portion 221 is separated from the insulating substrate 201 by physical means.

In the foregoing steps, when adhesion between the micro-electro-mechanical device forming portion 221 and the peeling layer 202 is weak, the step of removing the peeling layer 202 may be omitted and the micro-electro-mechanical device forming portion 221 can be separated from the insulating substrate 201 by physical means.

Figure 13B:
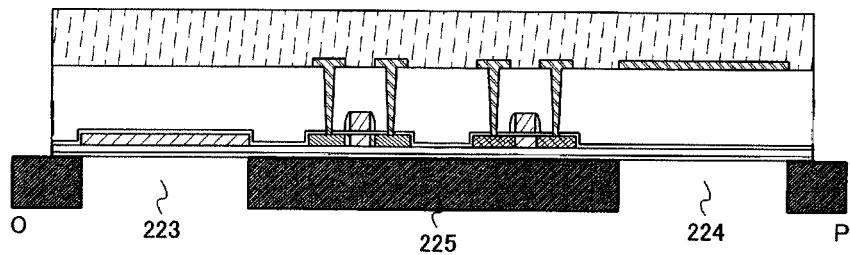

Next, the second sheet member 225 provided with openings 223 and 224 is attached to the other surface of the micro-electro-mechanical device forming portion 221 and either or both heat treatment and pressure treatment are performed so that the second sheet member 225 adheres thereto. Upon providing or after providing the second sheet member 225, the first sheet member 222 is separated (FIG. 13B). At that time, the openings 223 and 224 of the second sheet member 225 are provided in a position corresponding to the first structure layer 205 and the second structure layer 218, respectively. In addition, an insulating layer of a nitride compound such as silicon nitride or oxide such as silicon oxide formed by CVD or the like or a metal layer formed by sputtering or the like may be formed on the side surface of the opening portions 223 and 224. The metal layer formed on the side surface can be used as a wire.

Figure 13C:
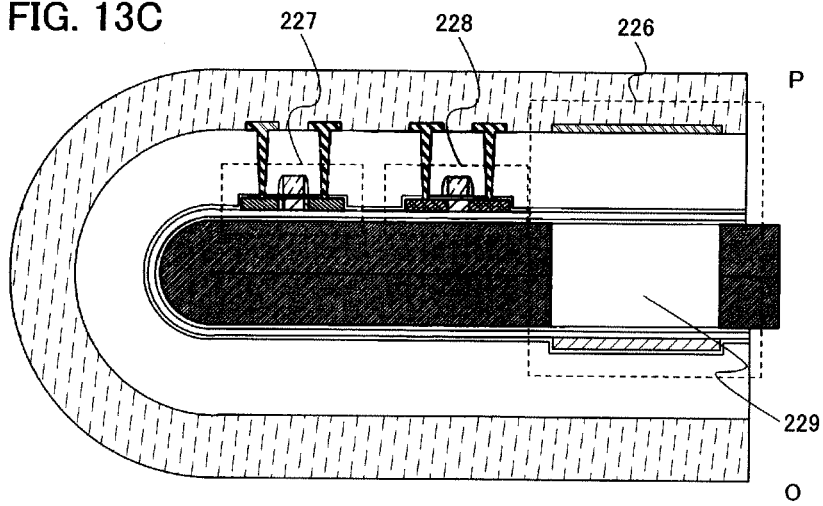

Then, the second sheet member 225 is folded so that the first structure layer 205 and the second structure layer 218 in the micro-electro-mechanical device forming portion 221 formed over the second sheet member 225, are opposite to each other (FIG. 13C). That is, the space 229 is formed by the openings 223 and 224 which are opposite to each other. At this time, in a region other than the openings 223 and 224, the second sheet member 225 is folded so that the surface thereof comes into contact; therefore, it is preferable that the second sheet member 225 have an adhesion property.

In addition, the second sheet member 225 is preferably formed of an organic material in order to reduce the impact of being folded. When an organic material is used for the second sheet member 225, the film thickness can be thick compared with when an inorganic material is used. Further, since an organic material has low hardness, the impact after completion of the product can be also reduced.

In addition, a space 229 may be closed by being sealed or may be opened. When the space is closed, a reference pressure is sealed therein and the space can be used as a pressure sensor.

With these steps, the space 229 whose side surface is surrounded by the second sheet member 225 and the top and bottom surfaces are surrounded by the base layer 203, that is, the space 229 which is surrounded by the second sheet member 225 and the base layer 203 is formed. Thus, the microstructure 226 and the semiconductor elements 227 and 228 are formed over one surface (FIG. 13C). By manufacturing the microstructure and the semiconductor element over one surface and simplifying the steps of forming the space for moving the microstructure and of packaging the microstructure and semiconductor element, a micro-electro-mechanical device with low manufacturing cost and improved production efficiency can be provided.

In addition, a structure may be employed, in which a micro-electro-mechanical device is covered with a film or the like to be protected in accordance with a type of the micro-electro-mechanical device and the intended purpose.

This embodiment mode can be freely combined with the foregoing embodiment modes.

Embodiment Mode 6

In this embodiment mode, an example of the structure of the micro-electro-mechanical device is described with reference to the drawings.

Figure 14:
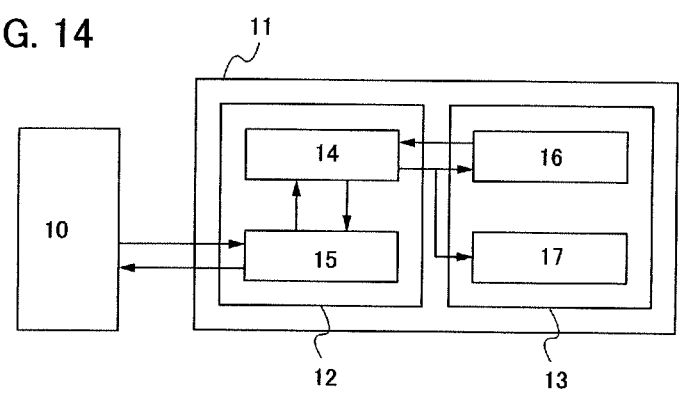
FIG. 14 shows an example of a semiconductor device of the present invention.

A schematic diagram of the micro-electro-mechanical device of the present invention is shown in FIG. 14. A micro-electro-mechanical device 11 of the present invention includes an electric circuit portion 12 including a semiconductor element and a structure portion 13 constituted from a microstructure. The electric circuit portion 12 includes a control circuit 14 for controlling the microstructure, an interface 15 for communicating with an external control device 10, and the like. The structure portion 13 includes a sensor 16, an actuator 17, a switch, and the like by using the microstructure.

An actuator refers to a component element for converting a signal (mainly an electrical signal) into a physical quantity.

Further, the electric circuit portion 12 can also include a central processing unit or the like for processing information obtained by the structure portion 13.

The external control device 10 performs operation such as transmitting a signal for controlling the micro-electro-mechanical device 11, receiving information obtained by the micro-electro-mechanical device 11, and supplying driving power to the micro-electro-mechanical device 11.

The invention is not limited to the above examples of structures. That is, a micro-electro-mechanical device of the present invention includes an electric circuit having a semiconductor element and controlling a microstructure, and the microstructure controlled by the electric circuit.

Conventionally, in the case of handling a minute object with a size of millimeter or smaller, a process has been required in which the structure of the minute object is enlarged, a person or a computer obtains its information to determine the data processing and operation, and the operation is reduced and transmitted to the minute object.

However, the micro-electro-mechanical device of the present invention which is described above allows operation of a minute object just by a person or a computer supplying a broader instruction. That is, when a person or a computer determines a purpose and transmits an instruction, the micro-electro-mechanical device can obtain and process information on an object by using a sensor or the like, and operate accordingly.

In the above example, the object is assumed to be minute. This includes, for example, a case where a size of object itself is in several meters but a signal sent therefrom is a small signal (e.g., a small change in light or pressure).

The micro-electro-mechanical device of the present invention is in the field of micromachines, and the size of the unit ranges from micrometers to millimeters. Further, in the case of manufacturing the micro-electro-mechanical device as a component to be incorporated in another mechanical apparatus, the micro-electro-mechanical device may have the size with of several meters so as to be able to handle easily in assembly.

Embodiment Mode 7

In this embodiment mode, an example of the micro-electro-mechanical device described in the above embodiment modes is described. The micro-electro-mechanical device of the present invention can be included in a sensor device in which a sensor element is formed with a microstructure.

Figure 15A:
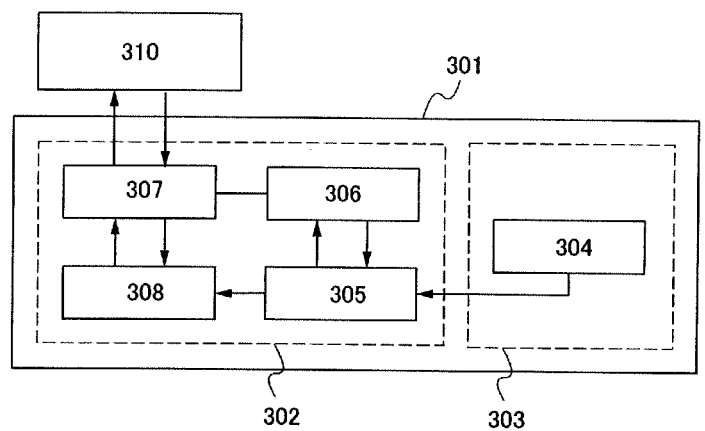
FIGS. 15A and 15B show a structure of a sensor.

FIG. 15A shows a structure of a sensor device 301 which is one example of the micro-electro-mechanical device of the present invention. The sensor device 301 of this embodiment mode includes an electric circuit portion 302 including a semiconductor element and a structure portion 303 constituted from a microstructure.

The structure portion 303 includes a sensor element 304 constituted from a microstructure, which detects external pressure, concentration of a substance, a flow rate of gas or fluid, or the like.

The electric circuit portion 302 includes an A/D converting circuit 305, a control circuit 306, an interface 307, a memory 308, and the like.

The A/D converting circuit 305 converts information transmitted from the sensor element into a digital signal. The control circuit 306 controls the A/D converting circuit so that, for example, the digital signal is stored in the memory. The interface 307 receives driving power or a control signal from an external control device 310, or transmits sensing information to the external control device 310, or the like. The memory 308 stores sensing information, information specific to the sensor device, or the like.

Further, the electric circuit portion 302 can also include an amplifier circuit for amplifying a signal received from the structure portion 303, a central processing unit for processing information obtained by the structure portion 303, or the like.

The external control device 310 performs operation such as transmitting a signal for controlling the sensor device 301 and receiving information obtained by the sensor device 301, or supplying driving power to the sensor device 301.

With the sensor device 301 having the above structure, external pressure, concentration of a substance, a flow rate of gas or fluid, temperature, or the like can be detected. Further, in the case where the sensor device includes a central processing unit, a sensor device in which detected information is processed in the sensor device and a control signal for controlling another device is generated and outputted, can also be realized.

Figure 15B:
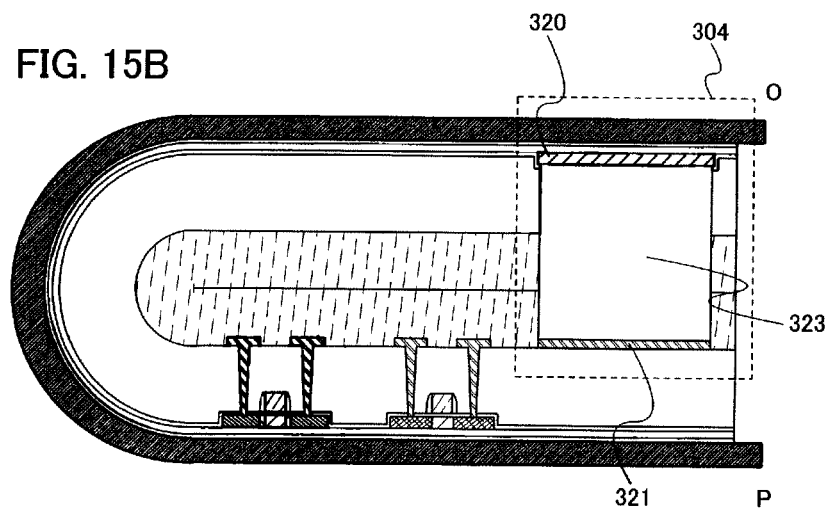

FIG. 15B is a cross-sectional view showing an example of a structure of the sensor element 304. The sensor element 304 shown in FIGS. 15A and 15B is a capacitor including a space 323, a first conductive layer 320 as a first structure layer in the foregoing embodiment modes, and a second conductive layer 321 as a second structure layer in the foregoing embodiment modes. Further, since the space 323 is provided, the first conductive layer 320 can be moved by electrostatic force, pressure, or the like. That is, the sensor element 304 is a variable capacitor in which the distance between the first conductive layer and the second conductive layer changes, which means the space changes in shape.

In addition, the space 323 may be closed by being sealed or may be opened. When the space is closed, a reference pressure is sealed therein and the space can be used as a pressure sensor.

Utilizing this structure, the sensor element 304 can be used as a pressure sensor element in which the first conductive layer 320 is moved by pressure.

In addition, in the sensor element 304 shown in FIG. 15B, the first conductive layer 320 can be formed by stacking two kinds of substances having different coefficients of thermal expansion. In this case, since the first conductive layer 320 is moved by temperature change, the sensor element 304 can be used as a temperature sensor element.

The present invention is not limited to the above structure. That is, according to this embodiment mode, a sensor device includes an electric circuit which includes a semiconductor element and controls a microstructure, and a sensor element which is constituted from the microstructure controlled by the electric circuit and detects some physical quantity. Further, the sensor device is manufactured by the manufacturing method described in any one of the foregoing embodiment modes.

This embodiment mode can be freely combined with the foregoing embodiment modes.

Embodiment Mode 8

In this embodiment mode, a specific example of the micro-electro-mechanical device described in the foregoing embodiment modes is described. The micro-electro-mechanical device of the present invention can constitute a memory device in which a memory element includes a microstructure. In this embodiment mode, an example of a memory device is described in which a peripheral circuit such as a decoder is formed using a semiconductor element or the like, and the inside of a memory cell is formed using a microstructure.

Figure 16:
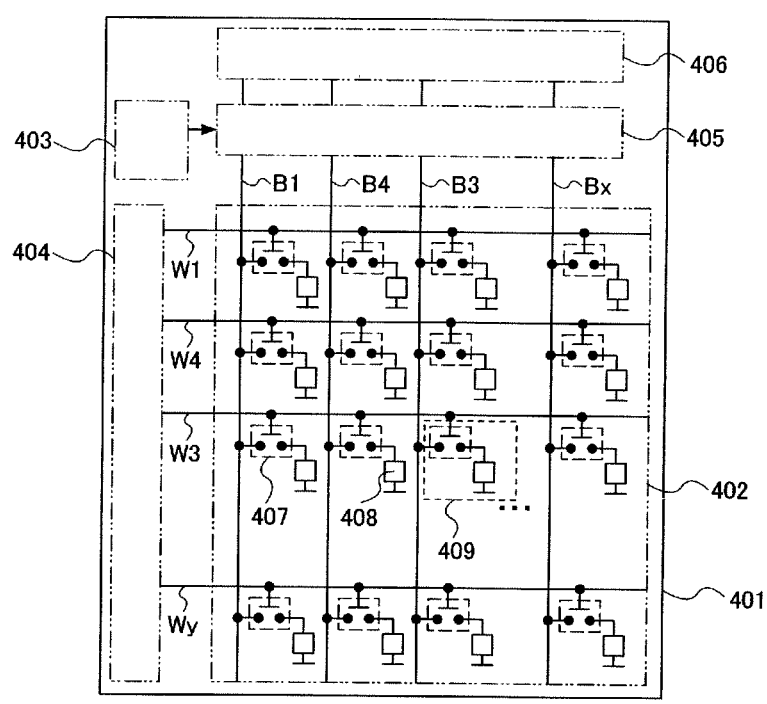
FIG. 16 shows a structure of a memory cell.

FIG. 16 shows a structure of a memory device 401 which is one example of the micro-electro-mechanical device of the present invention.

The memory device 401 includes a memory cell array 402, decoders 403 and 404, a selector 405, and a reading/writing circuit 406. A known structure can be used for the decoders 403 and 404 and the selector 405.

A memory cell 409 includes, for example, a memory element 408 and a switching element 407 for controlling the memory element. In the memory device 401 described in this embodiment mode, the switching element 407 and/or the memory element 408 are/is constituted from a microstructure.

Figure 17A:
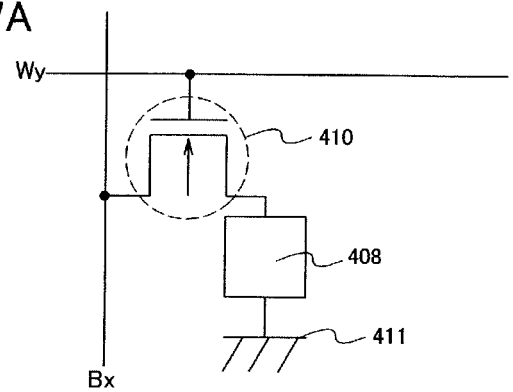
FIGS. 17A and 17B show a structure of a memory cell.
Figure 17B:
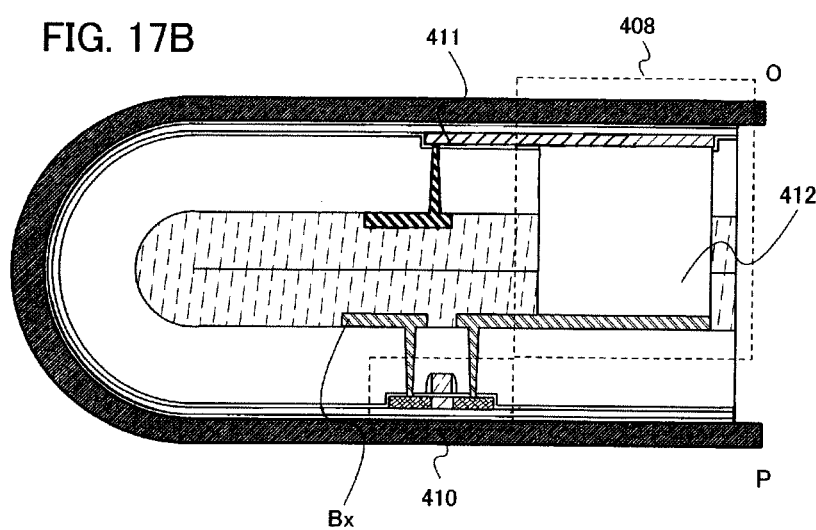

FIGS. 17A and 17B show an example of a structure of the memory cell 409. FIG. 17A is a circuit diagram of the memory cell 409 and FIG. 17B is a cross-sectional view of the structure.

As shown in FIG. 17A, the memory cell 409 includes the switching element 407 constituted from a transistor 410 and the memory element 408 constituted from a microstructure.

As shown in FIG. 17B, the memory element 408 includes a space 412 and has a microstructure formed using the manufacturing method described in foregoing embodiment modes. The memory element 408 is a capacitor including conductive layers as structure layers with the space 412 interposed. Further, one of the conductive layers is connected to one of two high-concentration impurity regions in the transistor 410.

In addition, the space 412 may be closed by being sealed or may be opened. When the space is closed, a reference pressure is sealed therein and the space can be used as a pressure sensor.

One of the conductive layers is commonly connected to the memory elements 408 of all the memory cells 409 in the memory device 401. The conductive layer applies the same potential to all the memory elements at the time of reading and writing of the memory device, which may be referred to as a common electrode 411 in this specification.

The memory device having the above structure can be used as a volatile memory, typically as a DRAM (Dynamic Random Access Memory). In the manufacturing process, the memory device can be used as a mask ROM by changing a gap in a capacitor. The memory device can be used as a write-once memory by means with which the memory device is broken. A known technology can be used for the structure of the peripheral circuit and the driving method or the like.

This embodiment mode can be freely combined with the foregoing embodiment modes.

Embodiment Mode 9

In this embodiment mode, an example of the micro-electro-mechanical device described in the foregoing embodiment modes is described.

The micro-electro-mechanical device of the present invention can be formed as, for example, a fractionation device for separating particular cells. The fractionation device is described hereinafter.

Figure 18A:
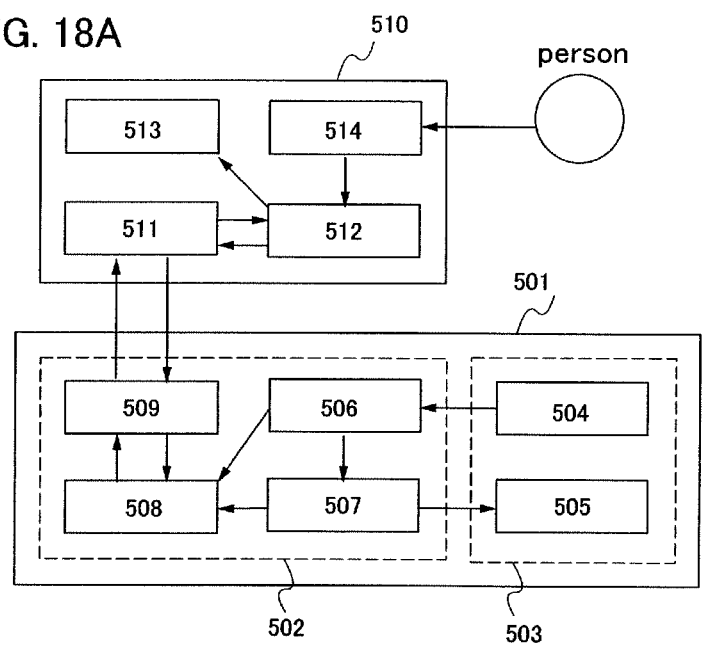
FIGS. 18A and 18B show an example of a semiconductor device of the present invention.
Figure 18B:
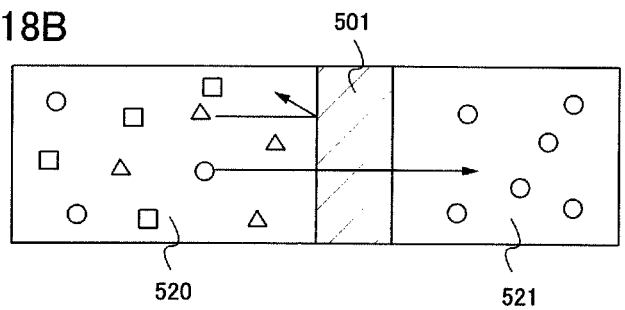

FIGS. 18A and 18B show an example of a basic structure of the fractionation device of this embodiment mode. Here, a fractionation device which separates particular cells from two or more cells is described as an example of the fractionation device.

A fractionation device 501 is broadly divided into two parts of an electric circuit portion 502 and a structure portion 503. The structure portion 503 includes a sensor element 504 and a plurality of gating means 505. The electric circuit portion 502 includes a signal processing means 506, a gating control means 507, an information storing means 508, and a communication means 509.

Here, each of the sensor element 504 and the gating means 505 is constituted from a microstructure with a size corresponding to a cell to be separated. One sensor element 504 is provided adjacent to one gating means 505, and detects what kind of material exists near the gating means 505. The gating means 505 has a passage which is opened only when a control signal is received from the gating control means 507 and particular cells exists near the gating means 505, so that the particular cells pass therethrough.

The signal processing means 506 processes a signal transmitted from the sensor element 504 by amplification, A/D conversion, or the like, to transmit to the gating control means 507. The gating control means 507 controls the gating means 505 based on a signal transmitted from the sensor element 504. The information storing device 508 stores a program file for operating the fractionation device 501, information specific to the fractionation device 501, or the like. The communication means 509 communicates with an external control device 510.

The external control device 510 includes a communication means 511, an information processing means 512, a display means 513, an input means 514, or the like.

The communication means 511 transmits a signal for controlling the fractionation device 501 and receives information obtained by the fractionation device 501, or supplies driving power to the fractionation device 501, or the like. The information processing means 512 performs operation such as processing information received from the fractionation device 501, and processing to transmit information inputted by the input means to the fractionation device 501. The display means 513 displays information obtained by the fractionation device 501, the operation status of the fractionation device 501, and the like. The input means 514 provides a means of inputting information.

FIG. 18B shows one example of using the fractionation device 501. The fractionation device 501 having the above structure is disposed between a mixed cell layer 520 and a specified cell layer 521. The fractionation device 501, after receiving information on what cell to be separated or the like by the external control device 510, detects what kind of cell exists adjacently to the gating means 505 by the sensor element 504. Next, a detection signal is processed by the signal processing means 506 and transmitted to the gating control means 507. The gating control means 507 controls the gating means 505 to open the passage only when a cell to be separated exists closely to the gating means 505. Further, the gating means 505 passes only the cell to be separated through the passage in accordance with control by the gating control means 507.

Through the above operation, the fractionation device 501 can separate a particular cell from mixed cells of two or more kinds. With the foregoing structure, the fractionation device 501 can be controlled to separate only a cell which fluoresces when irradiated with UV light. In addition, a fractionation device having a function of separating only particles which have a minute grain boundary, such as, particles containing a radioactive substance, or magnetic ore particles can be realized. Further, the fractionation device 501 is not limited to cell fractionation. For example, using the above structure, the fractionation device can also be constituted as a device for separating a particular gas.

The present invention can provide a separation system including the fractionation device 501, the mixed cell layer 520, the specified cell layer 521, and the external control device 510, for separating a particular cell from mixed cells.

This embodiment mode can be freely combined with the foregoing embodiment modes.

Embodiment Mode 10

In this embodiment mode, an example in which a micro-electro-mechanical device described in the foregoing embodiment modes and wireless communication technique are used.

In recent years, individual-identifying management communication technology using a wireless chip for storing information in an electronic circuit, a reader/writer for reading and writing information stored in the wireless chip, and a host system for processing the read information and controlling the reader/writer has been used. The wireless chip used in this embodiment mode is also referred to as a wireless communication ID tag, an IC tag, a wireless tag, or various other names. In this embodiment mode, the wireless chip is referred to as a semiconductor device. The semiconductor device is basically of nonbattery type which wirelessly communicates with the reader/writer by driving power obtained through electromagnetic wave emitted from the reader/writer.

Figure 19A:
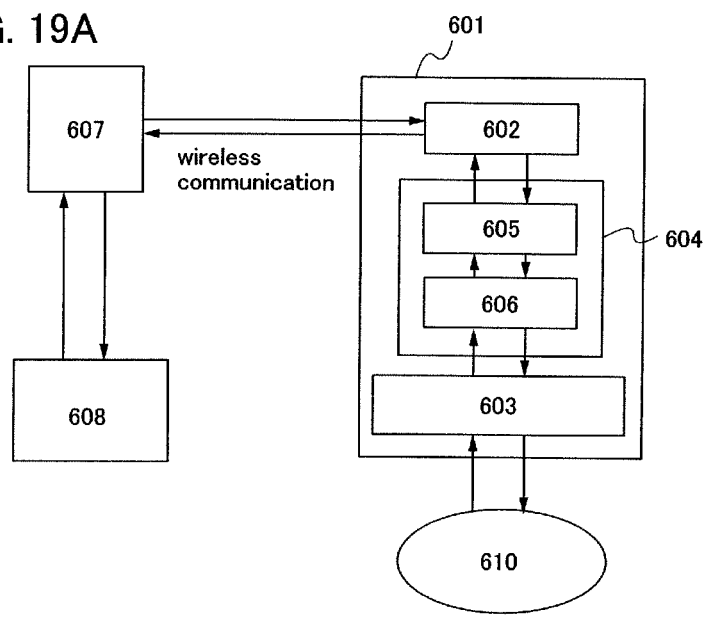
FIGS. 19A and 19B show an example of a semiconductor device of the present invention.

FIG. 19A shows an example of this embodiment mode. The semiconductor device 601 of this embodiment mode includes an antenna 602, a micro-electro-mechanical device 603, and an electric circuit 604. The electric circuit 604 includes a wireless communication circuit 605, and a processing circuit 606. The antenna 602 is connected to the wireless communication circuit. The micro-electro-mechanical device 603 is connected to the processing circuit 606.

The antenna 602 and the wireless communication circuit 605 receive an electromagnetic wave emitted from the reader/writer 607 which is externally provided and obtains driving power for driving the semiconductor device 601. The antenna 602 sends and receives information to and from the reader/writer 607 through an electromagnetic wave. The processing circuit 606 controls the micro-electro-mechanical device 603 based on the information received from the reader/writer 607 or processes information which the micro-electro-mechanical device 603 has received from an external object 610, and the like. The processing circuit 606 can have a so-called feedback mechanism. In the feedback mechanism, information which has been received from the micro-electro-mechanical device 603 and processed and information which has been transmitted from the reader/writer 607 are processed in combination to control the micro-electro-mechanical device 603.

The reader/writer 607 supplies drive power to the semiconductor device 601 through an electromagnetic wave and sends and receives information to and from the semiconductor device 601 through an electromagnetic wave. The operation of the reader/writer 607 is controlled by a host system, for example, a computer 608 here. The reader/writer 607 and the computer 608 may be connected through a communication line such as a USB (Universal Serial Bus) or may communicate wirelessly through an infrared ray or the like.

Figure 19B:
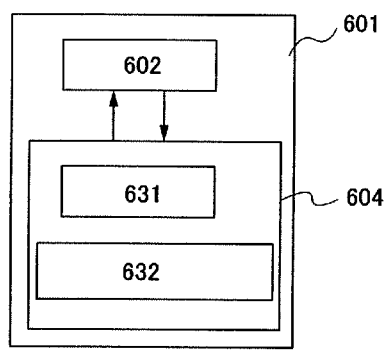

In addition, as shown in FIG. 19B, the semiconductor device 601 has the antenna 602 and the electric circuit 604. The electric circuit 604 can be formed by a semiconductor element 631 and a micro-electro-mechanical device 632. The electric circuit 604 has a wireless communication circuit, a processing circuit, and the like similarly to FIG. 19A, and the antenna 602 is connected to a circuit having a wireless communication function in the electric circuit 604. For example, by forming the circuit using the micro-electro-mechanical device 632 with high response speed, wireless communication using higher frequency can be performed.

The semiconductor device 601 of the present invention has the antenna 602 and the wireless communication circuit 605 as shown in the drawings, whereby a wire for inputting drive power and a control signal from outside is not provided and the semiconductor device is not required to be connected to the others physically.

Figure 20:
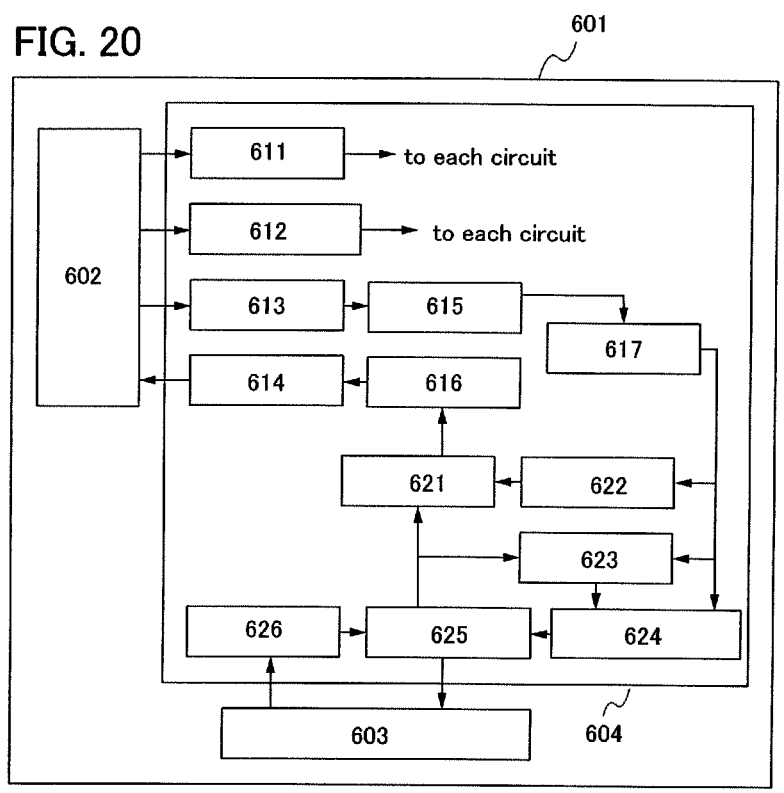
FIG. 20 shows an example of a semiconductor device of the present invention.

FIG. 20 shows a detailed structure of the electric circuit 604 of the semiconductor device 601. The electric circuit 604 receives an electromagnetic wave emitted from outside (here, the reader/writer 607) to generate electric power for driving the semiconductor device 601, and communicates with outside wirelessly. Therefore, the electric circuit 604 has a power source circuit 611, a clock generating circuit 612, a modulating circuit 613, a demodulating circuit 614, a decoding circuit 615, an encoding circuit 616, an information judging circuit 617, and the like, which are necessary for wireless communication. Moreover, in some cases, the semiconductor device has a different structure depending on frequency or a communication method used for the wireless communication.

Moreover, the electric circuit 604 has functions of controlling the micro-electro-mechanical device 603, processing information from the reader/writer 607, and so on. Therefore, the electric circuit 604 has a memory, a memory controlling circuit, an arithmetic circuit, and the like. FIG. 20 shows a structure in which the electric circuit 604 has a memory 621, a memory controlling circuit 622, an arithmetic circuit 623, a structure controlling circuit 624, an A/D converting circuit 625, and a signal amplifying circuit 626.

The power source circuit 611 has a diode and a capacitor and can hold constant voltage by rectifying alternating voltage generated at the antenna 602 and supply the constant voltage to each circuit. The clock generating circuit 612 has a filter or a frequency dividing circuit, whereby clock with required frequency can be generated based on the alternating voltage generated at the antenna 602 and the clock can be supplied to each circuit. Here, frequency of the clock generated by the clock generating circuit 612 is basically set to be equal to or lower than frequency of an electromagnetic wave with which the reader/writer 607 and the semiconductor device 601 communicate each other. Moreover, the clock generating circuit 612 has a ring oscillator and can generate a clock with arbitrary frequency by inputting voltage from the power source circuit 611.

The demodulating circuit 613 has a filter and an amplifying circuit, so that a signal included in alternating voltage generated at the antenna 602 can be demodulated. The demodulating circuit 613 has a circuit having a different structure depending on a modulation method used for the wireless communication. The decoding circuit 615 decodes a signal which has been demodulated by the demodulating circuit 613. This decoded signal is a signal which has been sent from the reader/writer 607. The information judging circuit 617 has a comparing circuit and the like, and can judge whether the decoded signal is a correct signal that has been sent from the reader/writer 607. If the signal is judged to be correct information, the information judging circuit 617 can send a signal showing that the signal is correct to each circuit such as the memory controlling circuit 622, the arithmetic circuit 623, or the microstructure controlling circuit 624, and the circuit having received the signal can perform predetermined operation.

The encoding circuit 616 encodes data to be sent from the semiconductor device 601 to the reader/writer 607. The modulating circuit 614 modulates the encoded data and sends the modulated data to the reader/writer 607 through the antenna 602.

The data to be sent to the reader/writer is data unique to the semiconductor device stored in a memory or data obtained by a function of the semiconductor device. The data unique to the semiconductor device is data such as identification information stored in a nonvolatile memory included in the semiconductor device. The data obtained by a function of the semiconductor device is, for example, data obtained by the micro-electro-mechanical device, data to which certain calculation has been conducted based on the data obtained by the micro-electro-mechanical device, and the like.

The memory 621 can have a volatile memory and a nonvolatile memory and stores data unique to the semiconductor device 601, information obtained from the micro-electro-mechanical device 603, and the like. Although the drawing shows only one memory 621, it is possible to have a plurality of memories in accordance with the kind of information to be stored and a function of the semiconductor device 601. The memory controlling circuit 622 has a function of controlling the memory 621 in the case of reading information stored in the memory 621 and writing information in the memory 621. Specifically, the memory controlling circuit 622 can generate a writing signal, a reading signal, a memory selecting signal, and the like; specify an address; and the like.

The microstructure controlling circuit 624 can generate a signal for controlling the micro-electro-mechanical device 603. For example, in the case of controlling the micro-electro-mechanical device 603 in accordance with an instruction from the reader/writer 607, a signal for controlling the micro-electro-mechanical device 603 is generated based on the signal decoded by the decoding circuit 615. In the case where data such as a program for controlling operation of the micro-electro-mechanical device 603 is stored in the memory 621, a signal for controlling the micro-electro-mechanical device 603 is generated based on the data read from the memory 621. Besides, it is possible to provide a feedback function for generating a signal for controlling the micro-electro-mechanical device 603 based on data in the memory 621, data from the reader/writer 607, and data obtained from the micro-electro-mechanical device 603.

The arithmetic circuit 623 can process data obtained from the micro-electro-mechanical device 603, for example. Moreover, the arithmetic circuit 623 can perform information processing and the like in the case where the microstructure controlling circuit 624 has a feedback function. The A/D converting circuit 625 is a circuit for converting analog data and digital data and transmits a control signal to the micro-electro-mechanical device 603. Alternatively, the A/D converting circuit 625 can convert data from the micro-electro-mechanical device 603 and transmit the data to each circuit. The signal amplifying circuit 626 can amplify a weak signal obtained from the micro-electro-mechanical device 603 and transmits the amplified signal to the A/D converting circuit 625.

The electric circuit 604 can have the foregoing circuit or the like. Although the electric circuit has the wireless communication circuit 605 and the processing circuit 606 in FIG. 19A, it is difficult to clearly discriminate, in some cases, where the wireless communication circuit 605 ends and where the processing circuit 606 starts in a detailed circuit shown in FIG. 20. This is because, for example, the memory 621 can be provided for either the wireless communication circuit 605 or the processing circuit 606. More specifically, the electric circuit 604 can have a nonvolatile and non-rewritable memory for storing information unique to the semiconductor device and a nonvolatile and rewritable memory for storing data which controls the micro-electro-mechanical device and data which is obtained from the micro-electro-mechanical device. The nonvolatile and non-rewritable memory can be provided as the wireless communication circuit 605 and the nonvolatile and rewritable memory can be provided as the processing circuit 606.

Therefore, the electric circuit 604 has the wireless communication circuit 605 for performing wireless communication and the processing circuit 606 for controlling the micro-electro-mechanical device 603 and processing an instruction from the reader/writer 607. As specific circuits for achieving those functions, the power source circuit 611, the memory 621, and the like described with reference to FIG. 20 are given. Whether these circuits form the wireless communication circuit 605 or the processing circuit 606 changes in accordance with the function and the like of the semiconductor device 601.

Although Embodiment Mode 1 is applied for the micro-electro-mechanical device 603 in this embodiment mode, this embodiment mode can be freely combined with the foregoing embodiment modes.

Figure 21A:
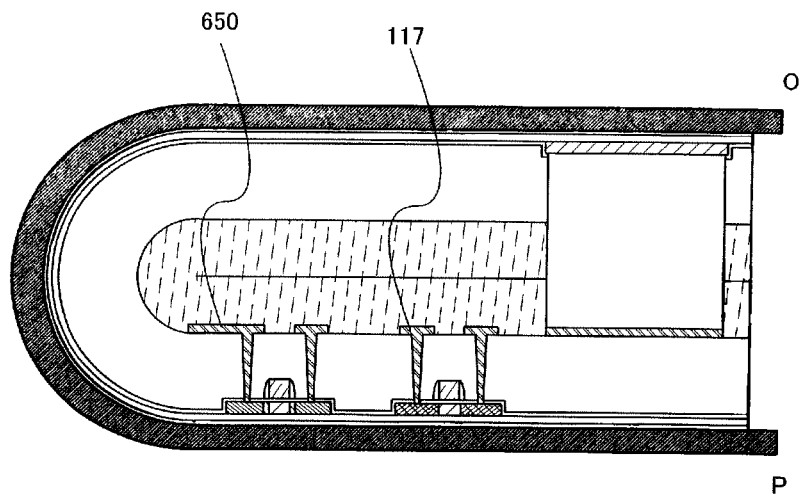
FIGS. 21A and 21B show an example of a semiconductor device of the present invention.

An antenna 650 is formed in a step of forming the conductive layer 117 in Embodiment Mode 1 (FIG. 21A).

Figure 21B:
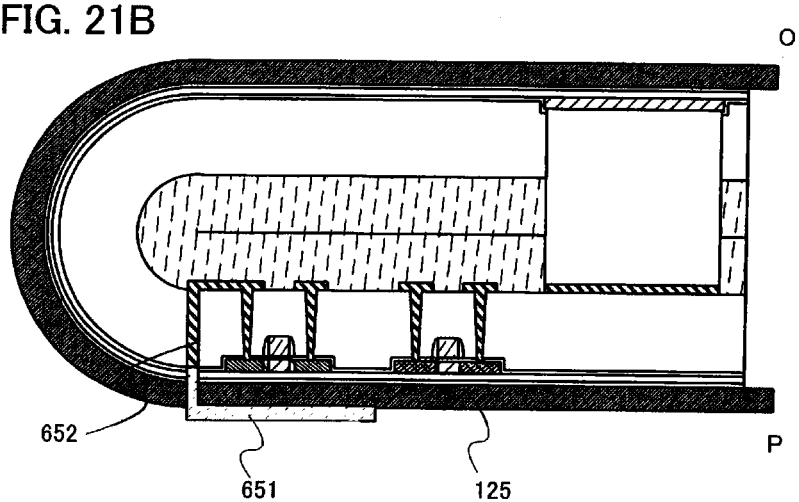

In addition, as shown in FIG. 21B, an antenna 651 can be formed outside the second sheet member 125. In that case, a wire 652 which electrically connects with the antenna 651 is formed in advance. Thus, a semicondcutor device utilizing wireless communication can be manufactured. In addition, a structure in which driving voltage of the semiconductor device is obtained can be realized by forming a power generation element using a piezoelectric material and thermoelectric material at the same time of forming the micro-electro-mechanical device forming portion. In that case, a structure may be employed in which a semiconductor device has both the foregoing power generation element and the antenna 651 and power is stably supplied. In addition, a structure which serves as a capacitor (a capacitor or battery) can be formed by changing a thin-film material or the structure thereof in the microstructure included in the micro-electro-mechanical device. Then, the power obtained by the foregoing power generation element and antenna can be stored in the capacitor, thereby supplying power to the semiconductor device. In addition, constant supply of the power can provide a longer wireless communication distance and usable time of the semiconductor device.

Embodiment Mode 11

In this embodiment mode, a specific structure and application example of the semiconductor device described in the foregoing embodiment mode are described with reference to the drawings.

Here, an example of the semiconductor device having a function of sending an operation signal of the micro-electro-mechanical device, discharging medicine to an area affected by disease, mixing dangerous chemicals, or the like is described.

Figure 22:
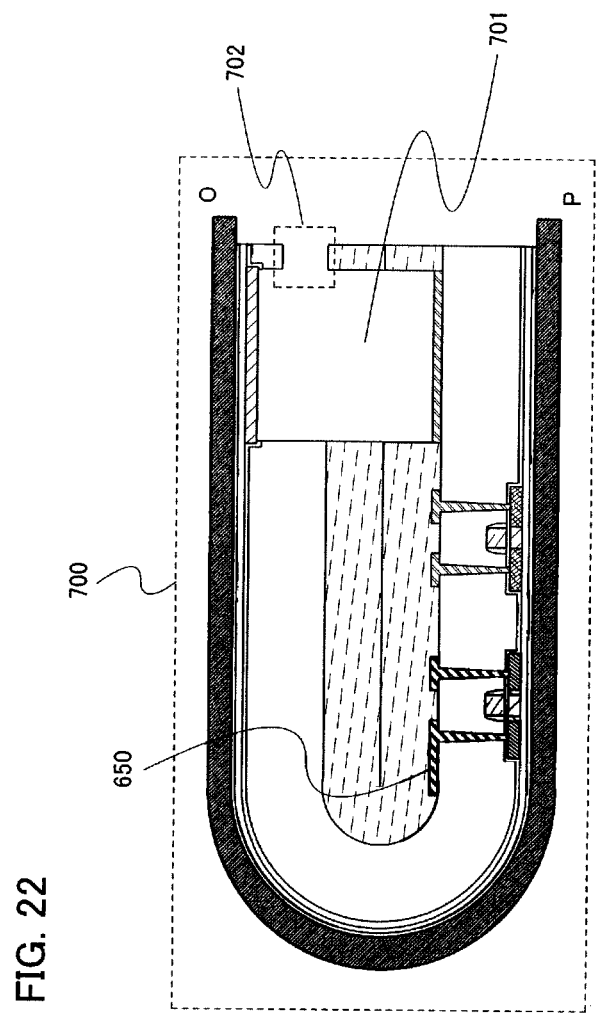
FIG. 22 shows an example of a semiconductor device of the present invention.

FIG. 22 is an example of the structure of a micro-electro-mechanical device 700 in this embodiment mode. The micro-electro-mechanical device 700 has a tank 701 for storing medicine, chemicals, or the like and a discharge opening 702 for discharging medicine, chemicals, or the like. In addition, the antenna 650 is formed to communicate with the reader/writer wirelessly.

The tank 701 can be referred to as a space by being opened.

Figure 23:
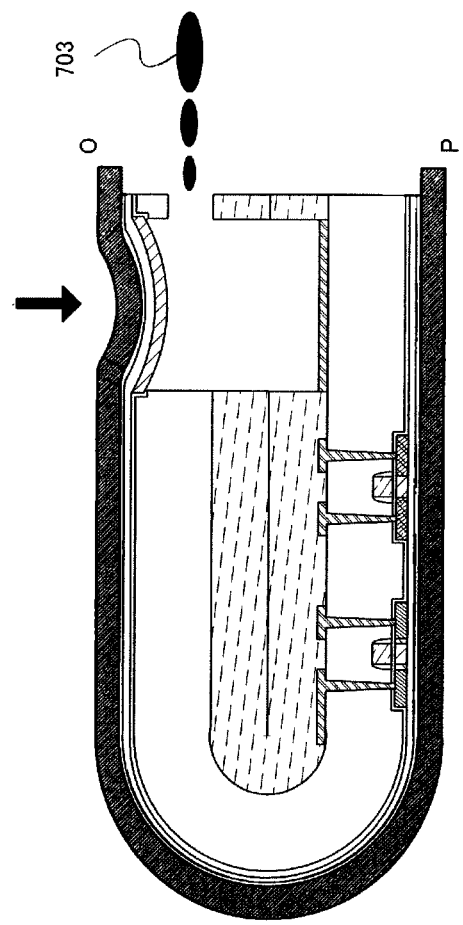
FIG. 23 shows an example of a semiconductor device of the present invention.

The micro-electro-mechanical device 700 receives driving power through an electromagnetic wave emitted from the reader/writer which is externally provided, and communicates wirelessly with the reader/writer. Then, the micro-electro-mechanical device 700 receives an operation signal from the reader/writer. The micro-electro-mechanical device 700 receives different polarities between the first structure layer and the second structure layer of the microstructure. The first structure layer is attracted to the second structure layer and is bent due to electrostatic force. Thus, the micro-electro-mechanical device 700 operates so that the tank 701 discharges the medicine or chemicals 703 therein through the discharge opening 702 (FIG. 23).

Figure 24A:
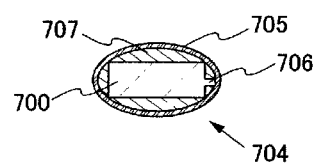
FIGS. 24A and 24B show an example of a semiconductor device of the present invention.

A semiconductor device 704 shown in FIG. 24A has a capsule 705 coated with a protective layer, in which the micro-electro-mechanical device 700 of this embodiment mode is provided. A passage 706 from the discharge opening 702 of the micro-electro-mechanical device 700 is provided. The passage 706 is not necessarily provided and the medicine or chemicals may be discharged outside the capsule 705 directly from the discharge opening 702. A filler 707 may be filled between the capsule 705 and the micro-electro-mechanical device 700.

The protective layer formed over the surface of the capsule preferably contains diamond like carbon (DLC), silicon nitride, silicon oxide, silicon nitride oxide, or carbon nitride. A known capsule and filler can be appropriately used. By providing the protective layer for capsule, the capsule and the semiconductor device can be prevented from being melted or changed in property inside of a body.

Besides, by making the outer surface of the capsule have a curved shape, the capsule does not hurt a human body; therefore, the capsule can be used safely.

The semiconductor device 704 of this embodiment mode can be put into a human body and injects a medicine to an area affected by disease. In addition, when the semiconductor device 704 is provided with additional function such as a sensor for detecting biological function data of body by measuring a physical amount and a chemical amount or a sampling means for sampling cells in the affected area, the obtained information can be signal-converted and processed by the electrical circuit and be sent to the reader/writer by wireless communication. Depending on the structure of the electrical circuit in the semiconductor device, the semiconductor device can have an advanced function, such as a function of exploring the area affected by disease based on the information obtained by the micro-electro-mechanical device, a function of judging whether the medicine is injected or not, or the like.

Figure 24B:
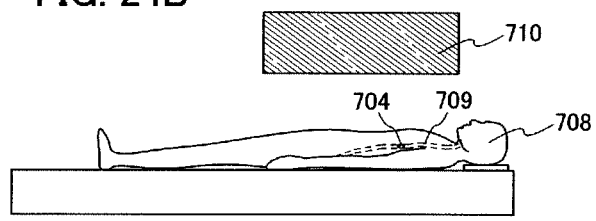

As shown in FIG. 24B, an examinee 708 swallows the semiconductor device 704, and the semiconductor device 704 is moved to a predetermined position in which the medicine is injected through a body cavity 709. The reader/writer 710 controls the semiconductor device 704 through wireless communication and the semiconductor device 704 discharges the medicine.

The semiconductor device 704 of this embodiment mode is applied not only to a medical purpose, but to wide application as a remote-controlled discharge device. For example, mixture of chemicals with a worker at risk such as generation of harmful gas or possibility of explosion can be performed by remote-controlling the semiconductor device 704 of this embodiment mode with the tank 701 thereof filled with the chemicals. Thus, a risk for the worker can be lowered significantly.

Embodiment Mode 12

As a specific example and another application example of the semiconductor device described in the foregoing embodiment modes are described in this embodiment mode with reference to the drawings.

Here, an example of a semiconductor device in which a micro-electro-mechanical device is used as a pressure sensor is described.

Figure 25A:
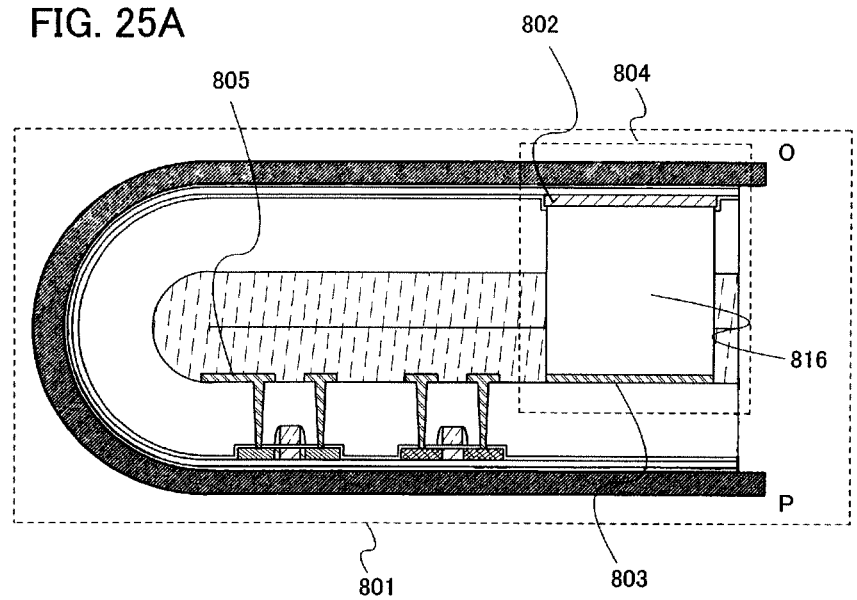
FIGS. 25A and 25B show an example of a semiconductor device of the present invention.

As shown in FIG. 25A, a micro-electro-mechanical device 801 includes a sensor element 804 having a first conductive layer 802 and a second conductive layer 803. In addition, the micro-electro-mechanical device 801 has a space 816 with which the first conductive layer 802 can move due to electrostatic force, pressure, or the like. That is, the sensor element 804 is a variable capacitor in which the distance between the first conductive layer and the second conductive layer changes which means the space changes in shape.

In addition, the space 816 may be closed by being sealed or may be opened. When the space is closed, a reference pressure is sealed therein and the space can be used as a pressure sensor.

Utilizing this structure, the sensor element 804 can be used as a pressure sensor element in which the first conductive layer 802 is moved by pressure.

The micro-electro-mechanical device 801 has an antenna 805 for communicating with a reader/writer wirelessly. The micro-electro-mechanical device wirelessly communicates with the reader/writer by driving power obtained through electromagnetic wave emitted from the reader/writer.

Figure 25B:
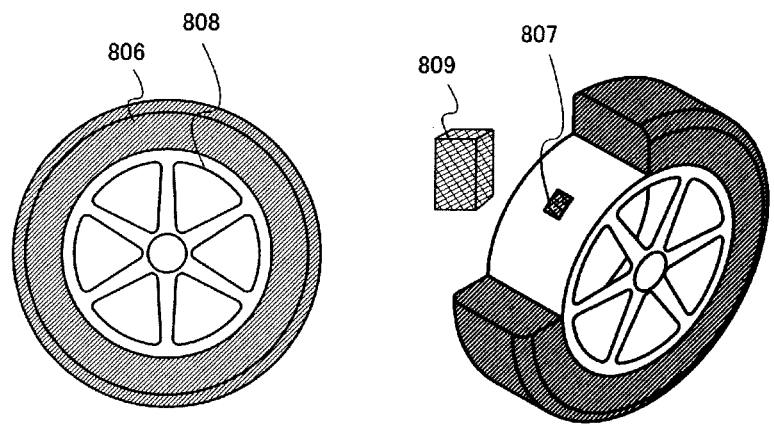

FIG. 25B is a specific example of the micro-electro-mechanical device 801 used as a pressure sensor. When the inflation pressure in a tire 806 of a car is lowered, the tire 806 deforms significantly and the resistance increases, which lead to deterioration in mileage performance and accidents. The semiconductor device of this embodiment mode can provide a system for monitoring the inflation pressure of the tire 806 relatively easily and regularly.

As shown in FIG. 25B, the semiconductor deice 807 in which the micro-electro-mechanical device 801 coated with a protective layer is placed at a wheel portion 808. A plurality of the semiconductor devices 807 is preferably provided. In that case, the semiconductor devices are placed so that the gaps therebetween are the same.

Then, a reader/writer 809 is placed close to the semiconductor device 807 and performs wireless communication, thereby obtaining information on the inflation pressure of the tire 806. The reader/writer 809 may be mounted on a vehicle. The wireless communication technique or the like are similar to that of foregoing Embodiment Mode 10.

According to this embodiment mode, an inflation pressure of tire can be monitored relatively easily and regularly without going to a car maintenance shop such as a gas station. When the reader/writer is mounted on the vehicle, the inflation pressure of the tire is monitored constantly, thereby preventing blowing out of the tire.

This application is based on Japanese Patent Application serial no. 2005-258072 filed in Japan Patent Office on Sep. 6, 2005, the entire contents of which are hereby incorporated by reference.

What is claimed is:

1. A micro-electro-mechanical device comprising:
   a first sheet member,
   a transistor over a first portion of the first sheet member;
   a first insulating layer over the transistor and the first sheet member;
   a first structure layer over the first insulating layer, over a second portion of the first sheet member;
   a second insulating layer over the first insulating layer, over the first portion of the first sheet member;
   a third insulating layer over the second insulating layer, over the first portion of the first sheet member, the third insulating layer being formed from a same layer as the first insulating layer;
   a second sheet member over the third insulating layer, over the first portion and the second portion of the first sheet member, the second sheet member being formed from a same sheet as the first sheet member; and
   a second structure layer on a downwards surface of the second sheet member, over the second portion,
   wherein the second insulating layer and the third insulating layer comprise an opening over the second portion of the first insulating layer; and
   wherein the first structure layer and the second structure layer face each other, separated by a space defined by the opening.

2. The micro-electro mechanical device according to claim 1, wherein the space is opened.

3. The micro-electro mechanical device according to claim 1, wherein the first structure layer or the second structure layer comprise stacked layers different in mechanical properties.

4. The micro-electro mechanical device according to claim 1, wherein the first structure layer is electrically connected to the transistor.

5. A pressure sensor comprising the micro-electro mechanical device according to claim 1.

6. A remote-controlled discharge device comprising the micro-electro mechanical device according to claim 1.

7. The micro-electro mechanical device according to claim 1,
   wherein the first sheet member and the second sheet member are part of a same sheet that has been folded; and
   wherein the first insulating layer and the third insulating layer are part of a same insulating layer that has been folded.

8. The micro-electro mechanical device according to claim 1, further comprising:
   an electrically conductive layer over the first insulating layer and electrically connected to the transistor through the first insulating layer,
   wherein the first structure layer is formed from a same film as the electrically conductive layer.

9. A micro-electro-mechanical device comprising:
   a sheet member,
   a transistor over a first portion of the sheet member, the transistor comprising a gate, a semiconductor element, a source and a drain;
   a first structure layer on a second portion of the sheet member, the first structure layer comprising a layer formed from a same layer as the semiconductor element of the transistor;
   a first insulating layer on the transistor and over a third portion of the sheet member;
   an electrically conductive layer over the first insulating layer and electrically connected to one of the source and the drain of the transistor through the first insulating layer;
   a second structure layer over the third portion of the sheet member, the second structure layer being formed over the first insulating layer from a same film as the electrically conductive layer; and
   a second insulating layer over the electrically conductive layer;
   wherein the second insulating layer is not formed over the third portion of the sheet member;
   wherein the first insulating layer and the second insulating layer are not formed over the second portion of the sheet member; and
   wherein the sheet member, the first insulating layer and the second insulating layer are folded with the sheet member outside of the obtained structure, so that the second portion and the third portion of the sheet member face each other, the first insulating layer and the second insulating layer defining a space separating the first structure layer from the second structure layer.

10. The micro-electro mechanical device according to claim 9, wherein the space is opened.

11. The micro-electro mechanical device according to claim 9, wherein the first structure layer or the second structure layer comprise stacked layers different in mechanical properties.

12. The micro-electro mechanical device according to claim 9, wherein the second structure layer is electrically connected to one of the source and the drain of the transistor.

13. A pressure sensor comprising the micro-electro mechanical device according to claim 9.

14. A remote-controlled discharge device comprising the micro-electro mechanical device according to claim 9.

15. A micro-electro-mechanical device comprising:
   a first sheet member,
   a transistor comprising a semiconductor layer over a first portion of the first sheet member;
   a first insulating layer over the transistor and the first sheet member;
   a first structure layer over the first insulating layer, over a second portion of the first sheet member;
   a second insulating layer over the first insulating layer, over the first portion of the first sheet member;
   a third insulating layer over the second insulating layer, over the first portion of the first sheet member, the third insulating layer being formed from a same layer as the first insulating layer;
   a second sheet member over the third insulating layer, over the first portion and the second portion of the first sheet member, the second sheet member being formed from a same sheet as the first sheet member; and
   a second structure layer on a downwards surface of the second sheet member, over the second portion,
   wherein the second insulating layer and the third insulating layer comprise an opening over the second portion of the first insulating layer,
   wherein the first structure layer and the second structure layer face each other, separated by a space defined by the opening, and wherein the second structure layer is formed from a same film as the semiconductor layer.

16. The micro-electro mechanical device according to claim 15, wherein the first sheet member and the second sheet member are part of a same sheet that has been folded.

17. The micro-electro mechanical device according to claim 15,
wherein the first sheet member and the second sheet member are part of a same sheet that has been folded; and
wherein the first insulating layer and the third insulating layer are part of a same insulating layer that has been folded.

18. The micro-electro mechanical device according to claim 15, wherein the space is opened.

19. The micro-electro mechanical device according to claim 15, further comprising:
an electrically conductive layer over the first insulating layer and electrically connected to the transistor through the first insulating layer,
wherein the first structure layer is formed from a same film as the electrically conductive layer.

20. A pressure sensor comprising the micro-electro mechanical device according to claim 15.

21. A remote-controlled discharge device comprising the micro-electro mechanical device according to claim 15.

22. A micro-electro-mechanical device comprising:
a sheet member,
a transistor comprising a semiconductor layer over a first portion of a bottom part of the sheet member;
a first insulating layer over the transistor and the bottom part of the sheet member;
a first structure layer over the first insulating layer, over a second portion of the bottom part of the sheet member;
a second insulating layer over the first insulating layer, over the bottom part of the sheet member;
a third insulating layer over the second insulating layer, over the first portion of the bottom part of the sheet member, the third insulating layer being formed from a same layer as the first insulating layer; and
a second structure layer on a downwards surface of a top part of sheet member, over the second portion,
wherein the sheet member is folded so as to cover the third insulating layer;
wherein the second insulating layer and the third insulating layer comprise an opening over the second portion of the first insulating layer; and
wherein the first structure layer and the second structure layer face each other, separated by a space defined by the opening.

23. The micro-electro mechanical device according to claim 22, wherein the second structure layer is formed from a same film as the semiconductor layer.

24. The micro-electro mechanical device according to claim 22, wherein the first insulating layer and the third insulating layer are part of a same insulating layer that has been folded.

25. The micro-electro mechanical device according to claim 22, wherein the space is opened.

26. The micro-electro mechanical device according to claim 22, further comprising:
an electrically conductive layer over the first insulating layer and electrically connected to the transistor through the first insulating layer,
wherein the first structure layer is formed from a same film as the electrically conductive layer.

27. A pressure sensor comprising the micro-electro mechanical device according to claim 22.

28. A remote-controlled discharge device comprising the micro-electro mechanical device according to claim 22.

* * * * *